US008633573B2

(12) United States Patent  
Jain et al.

(10) Patent No.: US 8,633,573 B2  
(45) Date of Patent: Jan. 21, 2014

(54) STRAINED SEMICONDUCTOR MATERIALS, DEVICES AND METHODS THEREFORE

(75) Inventors: Jinendra Raja Jain, Stanford, CA (US); Roger T. Howe, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 488 days.

(21) Appl. No.: 12/706,112

(22) Filed: Feb. 16, 2010

(65) Prior Publication Data

US 2010/0207254 A1 Aug. 19, 2010

Related U.S. Application Data

(60) Provisional application No. 61/152,899, filed on Feb. 16, 2009.

(51) Int. Cl.
*H01L 29/06* (2006.01)
(52) U.S. Cl.
USPC ........ 257/629; 257/18; 257/19; 257/E29.006; 257/E21.211; 438/478; 438/703; 438/763
(58) Field of Classification Search
USPC .......... 257/629, E29.06, E21.211, 18, 19, 67; 438/478, 703, 763
See application file for complete search history.

(56) References Cited

U.S. PATENT DOCUMENTS

| 5,592,007 | A  | * | 1/1997  | Leedy .............................. 257/347 |
| 6,645,784 | B2 | * | 11/2003 | Tayebati et al. ................. 438/46 |
| 7,037,794 | B2 | * | 5/2006  | Beintner et al. ............. 438/300 |
| 2004/0108559 | A1 | * | 6/2004  | Sugii et al. ..................... 257/411 |
| 2004/0232504 | A1 |   | 11/2004 | Lal et al. ........................ 438/703 |
| 2004/0253792 | A1 |   | 12/2004 | Cohen et al. ................... 438/406 |
| 2005/0189589 | A1 | * | 9/2005  | Zhu et al. ....................... 257/347 |
| 2005/0233565 | A1 | * | 10/2005 | Zhu et al. ....................... 438/602 |
| 2006/0021961 | A1 | * | 2/2006  | Muchow et al. ................. 216/2 |
| 2007/0085131 | A1 | * | 4/2007  | Matsuo et al. ................. 257/315 |
| 2009/0045394 | A1 |   | 2/2009  | Smeeton et al. ................ 257/13 |
| 2009/0072351 | A1 | * | 3/2009  | Meunier-Beillard et al. . 257/615 |
| 2009/0155964 | A1 |   | 6/2009  | Chang et al. ................... 438/197 |
| 2009/0243003 | A1 |   | 10/2009 | Renna et al. ................... 257/414 |

* cited by examiner

*Primary Examiner* — Thinh T Nguyen
(74) *Attorney, Agent, or Firm* — Kaplan Breyer Schwarz & Ottesen, LLP

(57) ABSTRACT

Various applications are directed to a material stack having a strained active material therein. In connection with an embodiment, an active material (e.g. a semiconductor material) is at least initially and partially released from and suspended over a substrate, strained, and held in place. The release and suspension facilitates the application of strain to the semiconductor material.

20 Claims, 14 Drawing Sheets

STRAINED SEMICONDUCTOR MATERIALS, DEVICES AND METHODS THEREFORE

CROSS-REFERENCE TO RELATED APPLICATION AND PRIORITY INFORMATION

This application claims the benefit of U.S. Ser. No. 61/152,899 filed Feb. 16, 2009, which application is fully incorporated herein by reference.

FIELD OF THE INVENTION

The present invention relates generally to semiconductors, and more particularly to semiconductor devices involving strained semiconductor materials.

BACKGROUND OF THE INVENTION

A variety of electronic and optoelectronic fields and related devices use semiconductor materials to suit a variety of purposes. In many implementations, the properties of various materials used to make these devices are selected or otherwise tailored to suit specific applications.

One of many representative semiconductor fields that have been of significant interest in recent times is the field of optoelectronics. The field of optoelectronics includes those materials, structures, devices, circuits, and systems that have properties appropriate for facilitating optical-electrical energy and signal conversion, transmission, modulation, and detection. Most optoelectronic devices in production today use III-V materials to achieve high performance. However, in light of a number of drawbacks concerning III-Vs, including process/fabrication complexity, high material costs, and incompatibility with silicon (Si), among others, some researchers have begun exploring alternatives to these traditional approaches to optoelectronics problems.

Photodetectors, for example, are optoelectronic devices that convert optical signals into electrical signals. At a general level, a photodetector is at least partially comprised of a light-absorption medium that is in electrical contact with a set of electrodes. Light energy is absorbed in the medium by excitation of electrons from valence bands into conduction bands, while current is generated via the transport of these excited charge carriers to the electrodes and through an external circuit. In the case of light emission, light-emitting diodes (LEDs) and lasers are the optoelectronic counterparts to photodetectors, converting electrical energy into optical energy. At a general level, these light emitting devices are also at least partially comprised of an optically active medium, which may include a multiplicity of several materials with different characteristics, in electrical contact with sets of electrodes. In these types of devices, electrical energy is passed through the optical medium by the application of a potential difference via the electrodes. While current flows through the medium, some of the associated charge carriers recombine with each other as electrons drop from the conduction bands back to the valence bands. For radiative recombination events, the energy associated with these transitions is emitted in the form of light via photons. As a third category of optoelectronic devices, modulators modify light, converting electrical signals into optical signals. Generally, these types of devices are also at least partially comprised of an optically active medium, which may include a multiplicity of several materials with different characteristics, in electrical contact with sets of electrodes. The application of a potential difference across the optical medium via the electrodes changes its optical properties, modulating the properties of a beam of light passing through it.

Photodetectors, lasers, and modulators are some of the key components in optical communications systems and often operate at a wavelength range that is inclusive of about 1300 nm-1600 nm (i.e. they interact with light energy relatively efficiently at these wavelengths for these particular applications). For telecommunications, certain standards are defined around 1550 nm, where the 1528-1560 nm range is referred to as the "C-Band" and the 1561-1620 nm range is known as the "L-Band."

Many commercially available optoelectronic devices, such as the photodetectors, LEDs, lasers, and modulators described above, use type III-V materials such as GaAs, InGaAs, and GaN, which have the subset of disadvantages mentioned previously. For the particular examples here of photodetection, emission, and modulation, germanium (Ge) has attractive properties and is a promising silicon-compatible alternative as an optically active medium.

Unlike the III-V materials and their associated drawbacks, germanium does not undermine the performance of other devices that are built on a shared silicon-compatible platform. Therefore, silicon-compatible substrates can be used in a system that integrates other silicon-compatible electronic and/or optoelectronic devices and germanium-based optoelectronics, for example. Moreover, germanium fabrication and processing technologies are very similar to those used in traditional silicon manufacturing, reducing fabrication costs and complexity significantly compared to the III-Vs.

However, while bulk germanium may represent an attractive alternative to III-V materials for applications at the lower wavelength range, it suffers from limitations at wavelengths larger than about 1500 nm. In particular, bulk germanium has an absorption coefficient at 1550 nm that is about ½0th the absorption coefficients of some III-V materials (e.g. InGaAs), requiring a relatively thick germanium layer for comparable photodetection at this wavelength and resulting in low operating speeds. In terms of light emission, germanium's optical output is especially weak due to several competing phenomena. This less-than-optimal optoelectronic performance is directly related to the band structure of bulk germanium.

For the case of photodetection, when light is absorbed by a material, its energy is used to lift electrons above an energetic bandgap between the valence and conduction bands to higher-energy states. Thus, to first-order, if the incident light energy does not exceed the energy of the bandgap, the light cannot be absorbed and it passes through the medium undetected. In germanium, there are two particularly relevant bandgaps: the indirect L and the direct gamma. The indirect L bandgap is about 0.667 eV in energy, while the direct gamma bandgap represents an energy barrier of about 0.8 eV. In terms of light wavelength, these energies correspond to about 1860 nm and about 1550 nm, respectively.

Unfortunately, germanium cannot efficiently absorb light energy at the band edges for several reasons. Absorption leading to excitation above the indirect bandgap requires the co-action of a phonon-related momentum transfer along with the photon-related energy gain. The simultaneous occurrence of these two events at the right energy and momentum is relatively rare, resulting in small absorption coefficients for indirect gap transitions. For direct bandgap transitions at the germanium gamma point, the low density of available charge states near the conduction band edge limits the number of carriers that can be excited just above the direct gap. The density of such states increases beyond the band edge, but transitions to these states require higher-energy (smaller wavelength) photons. Photon absorptions and carrier excitations occur preferentially at the direct bandgap due to momentum conservation. Phonon-assisted momentum transfers are not necessary for such transitions.

In terms of light emission, the germanium band structure poses a more fundamental problem. The energy offset between the L and gamma bands and their relative difference in densities of states lead to preferential carrier occupation of the L valley and significantly stronger phonon-assisted non-radiative (rather than radiative) recombination. As a result, charge carriers that are injected into bulk germanium (e.g. via an applied potential difference) occupy the lower-energy L-valley states and can drop down to the valence band primarily only by recombining non-radiatively. Thus, it is very difficult to make bulk germanium emit light without injecting an inordinately large amount of charge carriers. Such high levels of carrier injection are impractical, requiring very high applied voltages and/or very low operating temperatures.

Applying different types of tensile strain to germanium alters its band structure, in part by reducing the direct bandgap relative to the indirect bandgap, thereby increasing the relative density of available states in the direct gamma valley and improving photon absorption and emission. In particular, reducing the direct bandgap via strain (e.g. biaxial tensile strain) can expand the useful range of light absorption and emission achievable by germanium-based photodetectors and emitters to include the L and C telecommunication bands, as well as the longer wavelengths. For instance, applying around 0.2% biaxial tensile strain to germanium increases its absorption coefficient at 1550 nm by about 7.5 times, compared to unstrained germanium.

However, approaches to applying tensile strain to germanium in a silicon-compatible manner have fallen far short of the levels desired, involved material configurations that introduce drawbacks for final device performance and capabilities, and/or have involved complex fabrication processes that require particularly tight controls. As a result of these complications and relative to telecommunications, for example, a large portion of the optical communications spectrum has been left relatively unsupported by germanium.

These and other matters have presented challenges to the design, manufacture and implementation of semiconductor devices, and in particular, of silicon-compatible devices such as those used in optoelectronics.

SUMMARY OF THE INVENTION

An object of the present invention is to provide new and improved semiconductor devices and their methods of manufacture.

A further object of the present invention is to provide new and improved semiconductor devices such as those used in electronics and/or optoelectronics and their methods of manufacture.

A further object of the present invention is to provide new and improved silicon-compatible semiconductor devices and their methods of manufacture.

A further object of the present invention is to provide new and improved silicon-compatible semiconductor devices such as those used in electronics and/or optoelectronics and their methods of manufacture.

A further object of the present invention is to provide semiconductor devices that include materials with highly-tunable strains and their methods of manufacture.

A further object of the present invention is to provide semiconductor devices that include materials with highly-tunable strains and are used in electronics and/or optoelectronics and their methods of manufacture.

A further object of the present invention is to provide silicon-compatible semiconductor devices that include materials with highly-tunable strains and their methods of manufacture.

A further object of the present invention is to provide silicon-compatible semiconductor devices that include materials with highly-tunable strains and are used in electronics and/or optoelectronics and their methods of manufacture.

A further object of the present invention is to provide semiconductor devices with engineered electronic and/or optoelectronic characteristics and their methods of manufacture.

A further object of the present invention is to provide silicon-compatible semiconductor devices with engineered electronic and/or optoelectronic characteristics and their methods of manufacture.

These and other objects of the present invention are achieved in a semiconductor device that includes a substrate, an active material, materials configured and arranged to induce a strain in the active material, materials configured and arranged to mitigate relaxation of the strain induced in the active material, and a support structure that suspends the active material over a portion of the substrate.

The present invention is exemplified in a number of implementations and applications, only some of which are summarized below.

According to one aspect, the present invention is directed to an active material including a semiconductor material, such as germanium, that is partially released from at least part of the underlying materials and/or substrate and strained by an adjacent material or related process. The release is used to set or otherwise control the application of strain, such as by controlling the active material's amenability to strain and to maintaining the strain.

According to another example embodiment, a semiconductor device includes a substrate, a material stack, and a support structure to support the released material stack over a portion of the substrate. The material stack includes a first material over the substrate, an active material on the first material, and a second material on the active material. At least one of the first and second materials is configured and arranged to induce a strain in the active material, and at least one of the first and second materials is configured and arranged to mitigate relaxation of the strain induced in the active material.

Other embodiments are exemplified in the figures, including those in the Appendix, which forms part of this patent document.

The above summary of the present invention is not intended to describe each illustrated embodiment or every other possible implementation of the present invention. The figures and detailed description that follow more particularly exemplify only certain embodiments.

BRIEF DESCRIPTION OF THE DRAWINGS

The present invention may be more completely understood in consideration of the detailed descriptions of various example embodiments of the invention that follow in connection with the accompanying drawings, in which.

Figure 1:
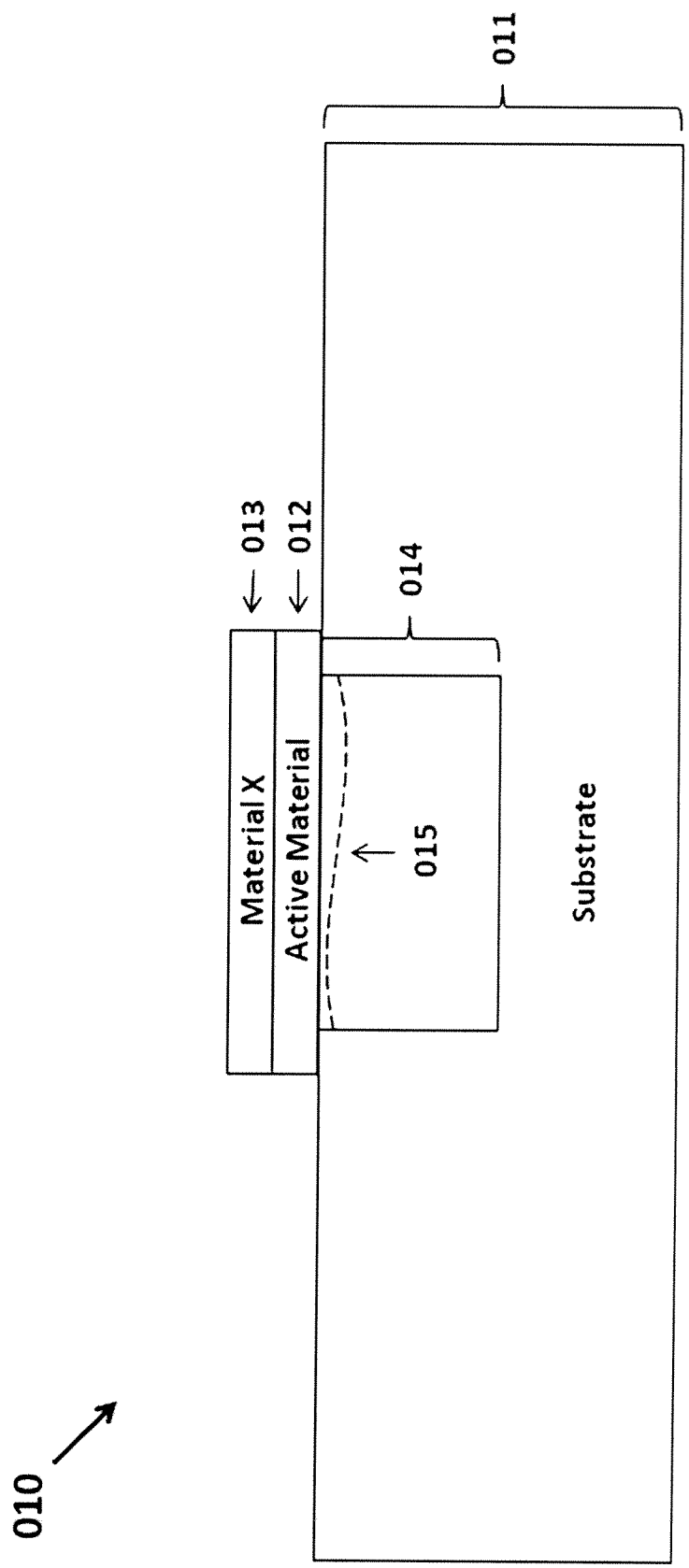
FIG. 1 depicts a cross-section of an active material-based structure having a strained active material vertically adjacent to an overlying material and an underlying substrate, a portion of which is removed to a depth within the underlying substrate under an area of the active material, according to an example embodiment of the present invention.

While the present invention is amenable to various modifications and alternative forms, specifics thereof have been shown by way of example in the drawings and will be described in detail. It should be understood, however, that the intention is not necessarily to limit the invention to the particular example embodiments described and claimed. On the contrary, the intention is to cover all modifications, equivalents, and alternatives falling within the spirit and scope of the invention.

DETAILED DESCRIPTION OF THE INVENTION AND DRAWINGS

The present invention is believed to be useful for a variety of different applications involving semiconductors, and the invention has been found to be particularly suited for semiconductor devices having strained active materials. While the present invention is not necessarily limited to such applications, various aspects of the invention may be appreciated through a discussion of several examples within this context.

The present invention can be utilized with a variety of different active materials with strained or straining active material-based layers and active materials that need not be in a layer structure, and further in connection with electronic and optoelectronic devices. The active material can actually include of a number of different materials grown on top of each other (e.g. several epilayers) or other materials arranged horizontally but in physical contact, or any of a variety of other material types, number, and configuration. By way of illustration, and without limitation, for a particular example laser configuration, including but not limited to, edge-emitter, VCSEL, and the like, SiGe, SiGeSn, or SiGeC quantum wells, or even the traditional III-V materials, can be deposited, and then the entire material stack can be strained after all the materials are formed.

As a non-limiting example, the active materials can be selected from one or more of, materials and film types including but not limited to, Si, Ge, SiGe, SiGeSn, SiGeC, III-V materials, graphene, nanotubes, nanowires, metals, and others. Applying strain to a material alters its band structure and electronic/optoelectronic properties. This opens up an entirely new space for devices across a variety of applications, not merely silicon-compatible optoelectronics.

However, these embodiments are exemplary and may be implemented in connection with different numbers and types of materials and with different types of devices. For instance, a silicon-based material or other semiconductor material may be used in place of the discussed active material. The materials, layers, and other structures discussed as implemented with optoelectronic devices may be implemented with a variety of other devices, such as transistors, thyristors, memory devices and others.

According to an example embodiment, an active material is used as part of an optoelectronic structure, with another material that strains the active material under conditions involving at least a partial suspension of the active material. The strained active material is held in a strained state. This approach is amenable to implementation with, for example, optical photodetectors, LEDs, lasers, modulators, and photonic crystals, as well as a wide variety of other devices and systems (including improvements to current ones).

In many implementations, the active material is suspended in a manner that avoids and/or removes a force-energy balance between a suspended portion of the active material and an underlying material. The material used to strain the active material has an internal stress that is transferred to the suspended active material due to a modified force-energy balance therebetween, altering the active material's band structure to adjust its electronic and/or optoelectronic properties. This stress transfer is particularly effective due to the suspended nature of at least part of the active material, in that the strain transfer and concomitant band structure alteration is not inhibited by physical contact between the suspended portion of the active material and at least one of the underlying materials.

The composition, dimensions (e.g. thickness), internal strain state, shape, or other geometrical arrangement of the suspended active material, the materials applying stress and/or other materials underlying or adjacent to the suspended material are used to set strain characteristics of the active material to suit particular applications. For instance, relatively large changes in atomic spacing can be achieved with a relatively thin active material (i.e. to induce high stress and/or strain).

In some implementations, a suspended region of the active material is sandwiched between two other materials to form a material stack that is supported at its ends and/or edges by an underlying substrate. The materials sandwiching the active material respectively apply strain to the active material, altering its band structure.

In some embodiments, the active material is formed on a substrate and subsequently suspended by removing a portion of the underlying substrate or materials, yet leaving some of the underlying materials or substrate in contact with at least part of the suspended active material to limit the amount of stress or strain applicable thereto, and to keep the structure intact and connected to the substrate. One such implementation involves using an active material-on-insulator (e.g. germanium-on-insulator (GOI) stack, in which an active material layer is formed on an insulator layer, and in which a portion of the material stack is suspended. In one of several process variations, another material layer, such as an insulator, is formed on top of the active material-on-insulator stack to induce strain in the active material layer. A region of an underlying substrate (e.g. silicon) is removed up to the bottom insulator to release the material stack, from the backside and/or from the topside in a certain pattern and using certain chemistries to etch under the region of interest. Removal of the substrate underneath the active material stack results in a thinner total material stack in the region of interest, to balance internal stresses of the insulators by much larger stresses in the active material than could have been achieved, absent the suspension (i.e. the active material will experience significant strain and a considerable alteration of its band structure).

In certain implementations, a portion of the substrate underlying the active material-on-insulator stack is left intact below the suspended material stack to set characteristics of the device. In other implementations, a portion of the insulator underlying the active material is removed as well, to similarly set characteristics of the device and of the active material. These approaches are readily implemented for a variety of different applications, to set or otherwise tune characteristics of the active material related to stress or strain therein and/or to tune or set device characteristics.

Turning now to the figures, FIG. 1 depicts a cross-section of an active material-based structure 010 having a strained active material 012 vertically adjacent to an overlying material 013 and an underlying substrate 011, a portion of which 014 is removed to a depth within the underlying substrate 011 under an area of the active material 012, according to an example embodiment of the present invention.

To facilitate the application of strain to the active material 012, a portion of the underlying substrate 011 is removed to expose a region 014, over which the active material 012 is suspended. As discussed above, the amount of the underlying substrate 011 removed below the active material 012 is based upon desired characteristics of the active material 012 and device/application considerations. Accordingly, dashed line 015 defines a region of the underlying substrate 011 that is left intact below the active material 012, as representing an exemplary approach to removing less than all of the substrate 011 underlying the suspended portion of the active material 012. Further, the amount of the underlying substrate 011 removed below the active material 012 to a depth within the underlying substrate 011 may also be determined by other desired material and device characteristics, which may include structural integrity of the remaining underlying substrate 011, device integration schemes, and others.

The overlying material 013 may include one or more of a variety of materials, which can be implemented to strain the active material 012 and/or to hold the active material 012 in a strained state. In some implementations, the overlying material 013 may be used to strain the active material 012, with the underlying substrate 011 used to hold the active material 012 in place. In other implementations, the underlying substrate 011 may be used to strain the active material 012, with the overlying material 013 used to hold the active material 012 in place. In still other implementations, both the overlying material 013 and the underlying substrate 011 may be used to both strain the active material 012 and hold the active material 012 in place. In still other implementations, other processing steps, such as thermal treatments, mechanical bending, and others, may be used to strain the active material 012, with the overlying material 013 and/or the underlying substrate 011 used to hold the active material 012 in place.

The specific fabrication process for the structure 010 can be carried out in one or more of a variety of manners, depending upon the desired material and device characteristics. In some embodiments, an initial active material-on-substrate stack (represented by 012 and 011) can be released from the underlying substrate 011 (e.g. as shown at region 014 with the region represented by dashed line 015 intact), followed by the formation of an overlying stressed material (represented by 013). In other embodiments, an overlying stressed material (represented by 013) is formed first, with the material stack released from the underlying substrate 011 afterwards. Different approaches to the final strained material stack may be useful for different embodiments.

In other example embodiments, the structure 010 is integrated with electronics and/or optoelectronics to facilitate the fabrication of electronic and/or optoelectronic devices, circuits, and systems in any of a variety of integration schemes. Optoelectronic devices with which the structure 010 may be used include, for example and without limitation, photodetectors, telecommunications devices, modulators, light-emitting diodes (LEDs), on-chip optical interconnects, lasers, quantum well modulators, waveguide lasers/modulators, photonic crystals and active material-based optoelectronics operating in the L and C telecommunications bands and at other wavelengths.

Other devices with which the structure 010 may be used in a variety of embodiments include devices that do not necessarily involve optoelectronics, such as transistor devices, memory devices, and others, with the application of strain used to set various properties of the active material 012. For instance, strain may be used to set charge carrier mobility, ON current, operating speed, and other electronic characteristics of transistors that include strained active materials (represented by 012).

Additionally, in some embodiments, the area of the removed portion 014 of the underlying substrate 011 is left as-is (i.e. empty as free space) after the portion 014 is removed. In other embodiments, this area is refilled with another material to satisfy any of a variety of desired material, device, circuit, and system characteristics.

Figure 2:
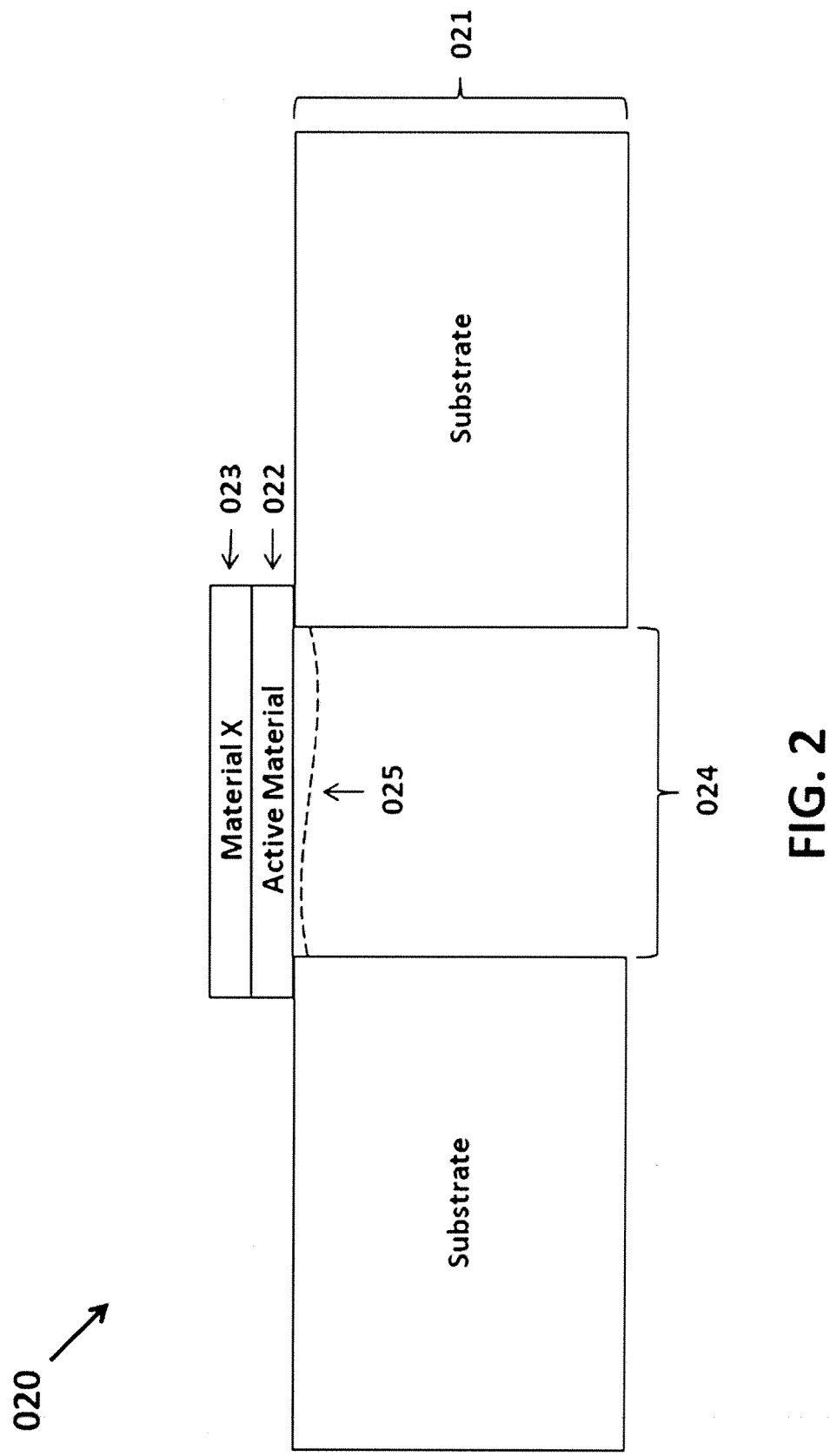
FIG. 2 depicts a cross-section of an active material-based structure having a strained active material vertically adjacent to an overlying material and an underlying substrate, a portion of which is removed to the bottom of the underlying substrate under an area of the active material, according to another example embodiment of the present invention.

FIG. 2 depicts a cross-section of an active material-based structure 020, similar to that shown in FIG. 1, having a strained active material 022 vertically adjacent to an overlying material 023 and an underlying substrate 021, a portion of which 024 is removed to the bottom of the underlying substrate 021 under an area of the active material 022, according to another example embodiment of the present invention.

As discussed above, to facilitate the application of strain to the active material 022, a portion of the underlying substrate 021 is removed to expose a region 024, over which the active material 022 is suspended. The amount of the underlying substrate 021 removed below the active material 022 is based upon desired characteristics of the active material 022 and device/application considerations. Accordingly, dashed line 025 defines a region of the underlying substrate 021 that is left intact below the active material 022, as representing an exemplary approach to removing less than all of the substrate 021 underlying the suspended portion of the active material 022.

As discussed above, in some embodiments, the structure 020 is integrated with electronics and/or optoelectronics to facilitate the fabrication of electronic and/or optoelectronic devices, circuits, and systems in any of a variety of integration schemes. In the structure 020, removal of a portion 024 of the underlying substrate 021 to the bottom of the underlying substrate 021 also facilitates integration with backside electronics and/or optoelectronics. Backside electronic and/or optoelectronic access to the active material 022 is made possible via the backside at 024 to permit different device, circuit, and system integration schemes. In some embodiments, the structure 020 may be used for applications involving wafer stacking (e.g. 3D integrated circuits), where electronic and/or optoelectronic access to the backside of the active material 022 is desired.

Additionally, as discussed above, in some embodiments, the area of the removed portion 024 of the underlying substrate 021 is left as-is (i.e. empty as free space) after the portion 024 is removed. In other embodiments, this area is refilled with another material to satisfy any of a variety of desired material, device, circuit, and system characteristics.

Figure 3:
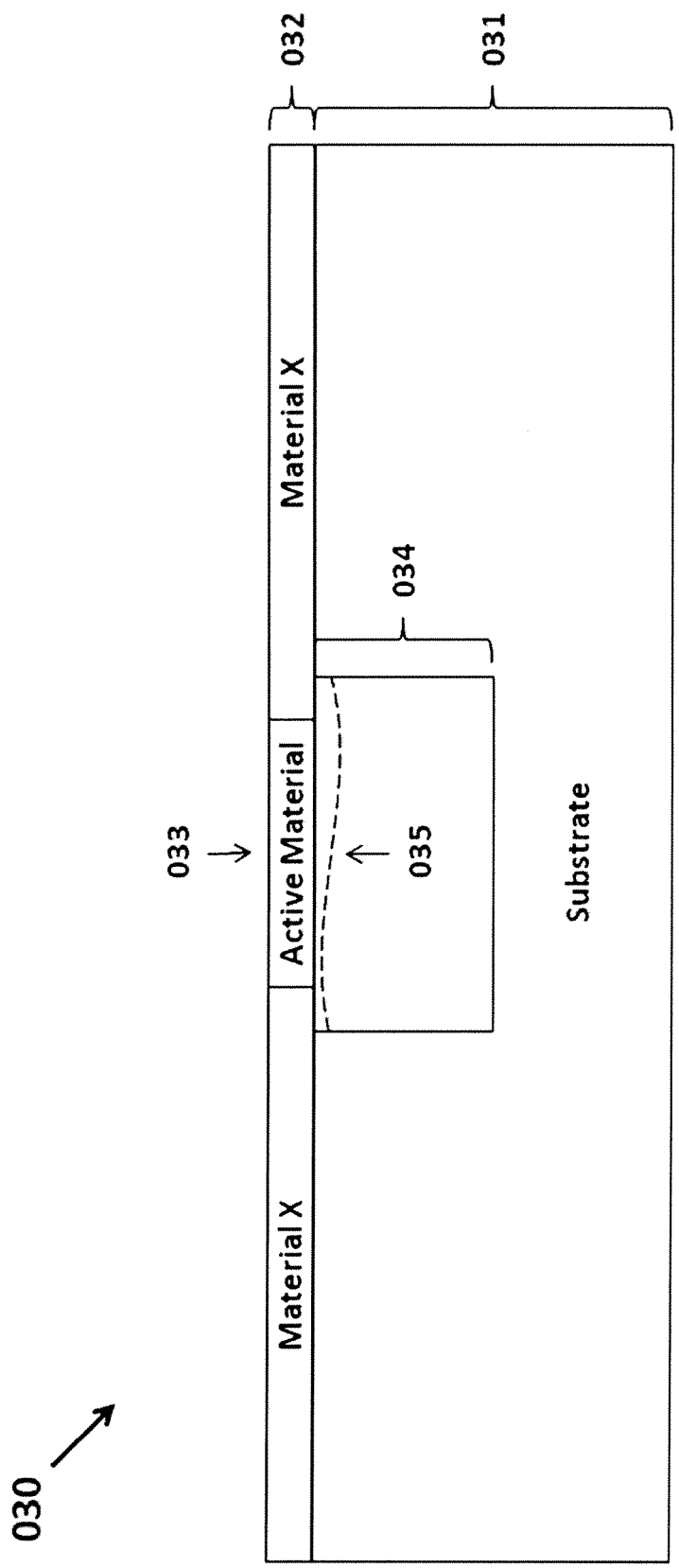
FIG. 3 depicts a cross-section of an active material-based structure having a strained active material horizontally adjacent to other materials and vertically adjacent to an underlying substrate, a portion of which is removed to a depth within the underlying substrate under an area of the active material, according to another example embodiment of the present invention.

FIG. 3 depicts a cross-section of an active material-based structure 030 having a strained active material 033 horizontally adjacent to other materials 032 and vertically adjacent to an underlying substrate 031, a portion of which 034 is removed to a depth within the underlying substrate 031 under an area of the active material 033, according to another example embodiment of the present invention.

As discussed above, to facilitate the application of strain to the active material 033, a portion of the underlying substrate 031 is removed to expose a region 034, over which the active material 033 is suspended. The amount of the underlying substrate 031 removed below the active material 033 is based upon desired characteristics of the active material 033 and device/application considerations. Accordingly, dashed line 035 defines a region of the underlying substrate 031 that is left intact below the active material 033, as representing an exemplary approach to removing less than all of the substrate 031 underlying the suspended portion of the active material 033. Further, the amount of the underlying substrate 031 removed below the active material 033 to a depth within the underlying substrate 031 may also be determined by other desired material and device characteristics, which may include structural integrity of the remaining underlying substrate 031, device integration schemes, and others.

The horizontally adjacent materials 032 may include one or more of a variety of materials, which can be implemented to strain the active material 033 and/or to hold the active material 033 in a strained state. In some implementations, the horizontally adjacent materials 032 may be used to strain the active material 033, with the underlying substrate 031 used to hold the active material 033 in place. In other implementations, the underlying substrate 031 may be used to strain the active material 033, with the horizontally adjacent materials 032 used to hold the active material 033 in place. In still other implementations, both the horizontally adjacent materials 032 and the underlying substrate 031 may be used to both strain the active material 033 and hold the active material 033 in place. In still other implementations, other processing steps, such as thermal treatments, mechanical bending, and others, may be used to strain the active material 033, with the horizontally adjacent materials 032 and/or the underlying substrate 031 used to hold the active material 033 in place.

The specific fabrication process for the structure 030 can be carried out in one or more of a variety of manners, depending upon the desired material and device characteristics. In some embodiments, an initial active material-on-substrate stack (represented by 033 and 031) can be partially released from the underlying substrate 031 (e.g. as shown at region 034 with the region represented by dashed line 035 intact), followed by the formation of horizontally adjacent stressed materials (represented by 032). In other embodiments, horizontally adjacent stressed materials (represented by 032) are formed first, with the material stack released from the underlying substrate 031 afterwards. Different approaches to the final strained material stack may be useful for different embodiments.

Additionally, as discussed above, in some embodiments, the area of the removed portion 034 of the underlying substrate 031 is left as-is (i.e. empty as free space) after the portion 034 is removed. In other embodiments, this area is refilled with another material to satisfy any of a variety of desired material, device, circuit, and system characteristics.

Figure 4:
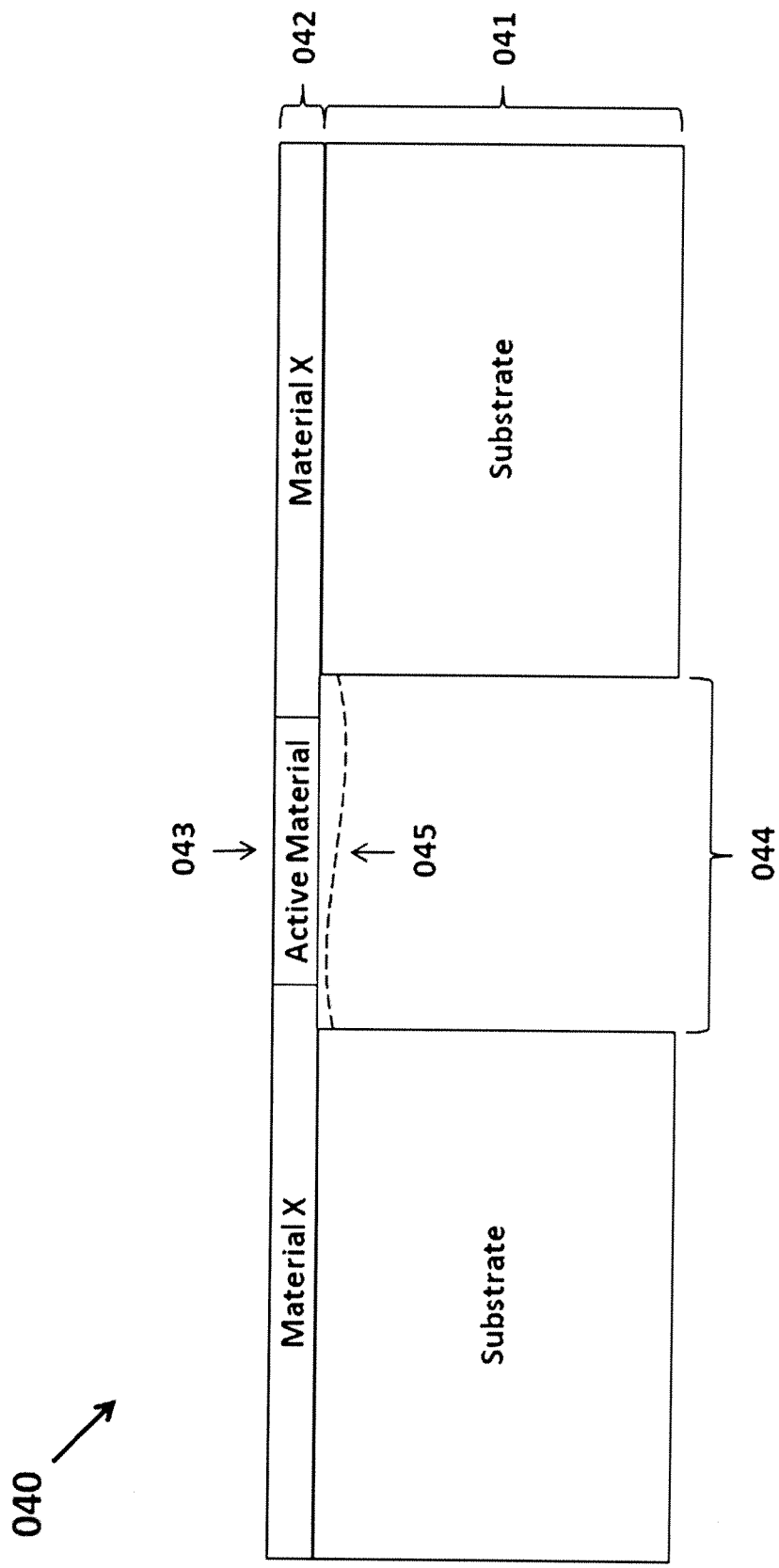
FIG. 4 depicts a cross-section of an active material-based structure having a strained active material horizontally adjacent to other materials and vertically adjacent to an underlying substrate, a portion of which is removed to the bottom of the underlying substrate under an area of the active material, according to another example embodiment of the present invention.

FIG. 4 depicts a cross-section of an active material-based structure 040, similar to that shown in FIG. 3, having a strained active material 043 horizontally adjacent to other materials 042 and vertically adjacent to an underlying substrate 041, a portion of which 044 is removed to the bottom of the underlying substrate 041 under an area of the active material 043, according to another example embodiment of the present invention.

As discussed above, to facilitate the application of strain to the active material 043, a portion of the underlying substrate 041 is removed to expose a region 044, over which the active material 043 is suspended. The amount of the underlying substrate 041 removed below the active material 043 is based upon desired characteristics of the active material 043 and device/application considerations. Accordingly, dashed line 045 defines a region of the underlying substrate 041 that is left intact below the active material 043, as representing an exemplary approach to removing less than all of the substrate 041 underlying the suspended portion of the active material 043.

Additionally, as discussed above, in some embodiments, the area of the removed portion 044 of the underlying substrate 041 is left as-is (i.e. empty as free space) after the portion 044 is removed. In other embodiments, this area is refilled with another material to satisfy any of a variety of desired material, device, circuit, and system characteristics.

Figure 5:
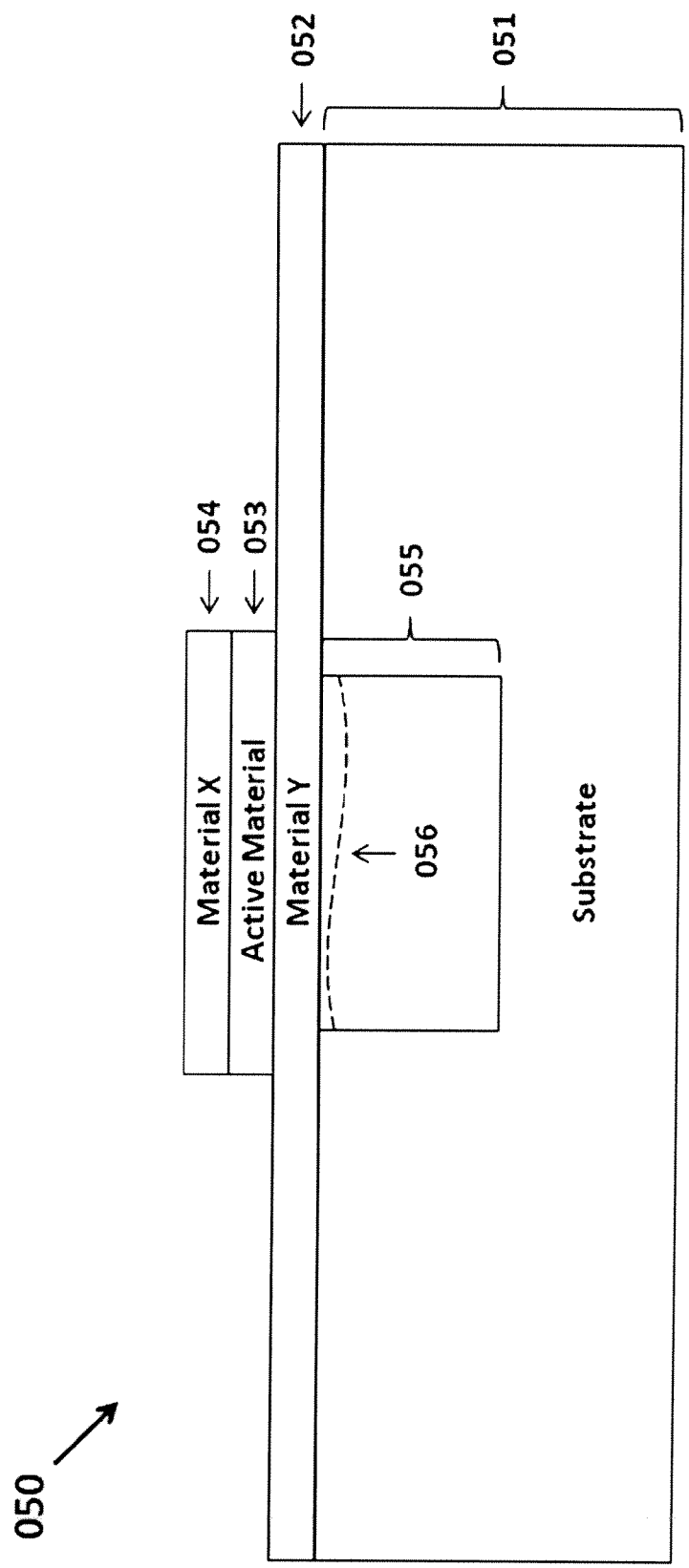
FIG. 5 depicts a cross-section of an active material-based structure having a strained active material vertically adjacent to an overlying material and an underlying material over an underlying substrate, a portion of which is removed to a depth within the underlying substrate under an area of the active material, according to another example embodiment of the present invention.

FIG. 5 depicts a cross-section of an active material-based structure 050 having a strained active material 053 vertically adjacent to an overlying material 054 and an underlying material 052 over an underlying substrate 051, a portion of which 055 is removed to a depth within the underlying substrate 051 under an area of the active material 053, according to another example embodiment of the present invention.

As discussed above, to facilitate the application of strain to the active material 053, a portion of the underlying substrate 051 is removed to expose a region 055, over which the active material 053 is suspended. The amount of the underlying substrate 051 removed below the active material 053 is based upon desired characteristics of the active material 053 and device/application considerations. Accordingly, dashed line 056 defines a region of the underlying substrate 051 that is left intact below the underlying material 052, as representing an exemplary approach to removing less than all of the substrate 051 underlying the suspended portion of the active material 053. Further, the amount of the underlying substrate 051 removed below the active material 053 to a depth within the underlying substrate 051 may also be determined by other desired material and device characteristics, which may include structural integrity of the remaining underlying substrate 051, device integration schemes, and others.

The respective materials 054 and 052 may include one or more of a variety of materials, which can be implemented to strain the active material 053 and/or to hold the active material 053 in a strained state. In some implementations, the overlying material 054 may be used to strain the active material 053, with the underlying material 052 used to hold the active material 053 in place. In other implementations, the underlying material 052 may be used to strain the active material 053, with the overlying material 054 used to hold the active material 053 in place. In still other implementations, both the overlying material 054 and the underlying material 052 may be used to both strain the active material 053 and hold the active material 053 in place. In still other implementations, other processing steps, such as thermal treatments, mechanical bending, and others, may be used to strain the active material 053, with the overlying material 054 and/or the underlying material 052 used to hold the active material 053 in place.

The specific fabrication process for the structure 050 can be carried out in one or more of a variety of manners, depending upon the desired material and device characteristics. In some embodiments, an initial active material-on-insulator stack (represented by 053, 052, and 051) can be released from the underlying substrate 051 (e.g. as shown at region 055), followed by the formation of an overlying stressed material (represented by 054). In other embodiments, an overlying stressed material (represented by 054) is formed first, with the material stack released from the underlying substrate 051 afterwards. Different approaches to the final strained material stack may be useful for different embodiments.

Additionally, as discussed above, in some embodiments, the area of the removed portion 055 of the underlying substrate 051 is left as-is (i.e. empty as free space) after the portion 055 is removed. In other embodiments, this area is refilled with another material to satisfy any of a variety of desired material, device, circuit, and system characteristics.

Figure 6:
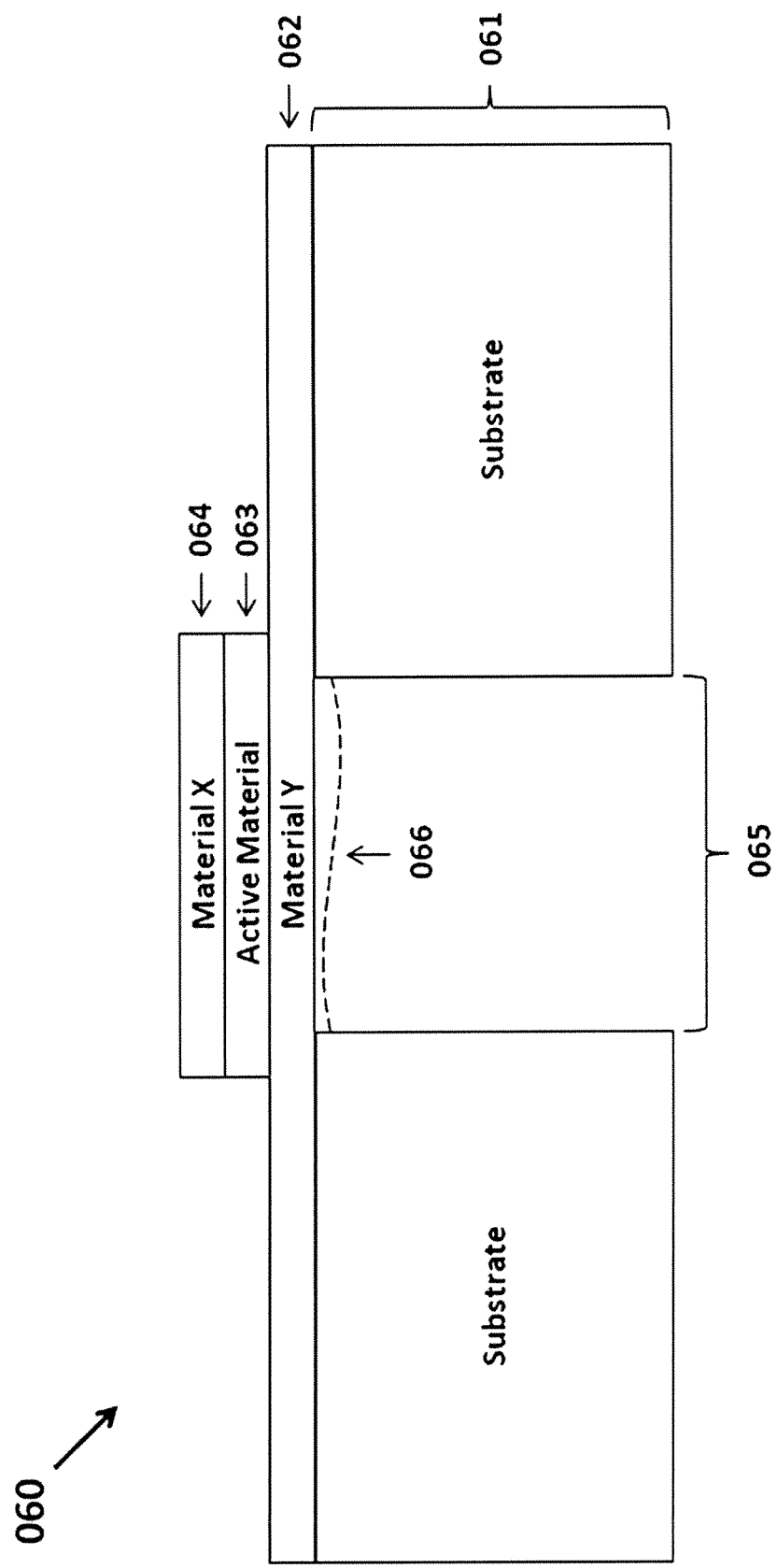
FIG. 6 depicts a cross-section of an active material-based structure having a strained active material vertically adjacent to an overlying material and an underlying material over an underlying substrate, a portion of which is removed to the bottom of the underlying substrate under an area of the active material, according to another example embodiment of the present invention.

FIG. 6 depicts a cross-section of an active material-based structure 060, similar to that shown in FIG. 5, having a strained active material 063 vertically adjacent to an overlying material 064 and an underlying material 062 over an underlying substrate 061, a portion of which 065 is removed to the bottom of the underlying substrate 061 under an area of the active material 063, according to another example embodiment of the present invention.

As discussed above, to facilitate the application of strain to the active material 063, a portion of the underlying substrate 061 is removed to expose a region 065, over which the active material 063 is suspended. The amount of the underlying substrate 061 removed below the active material 063 is based upon desired characteristics of the active material 063 and device/application considerations. Accordingly, dashed line 066 defines a region of the underlying substrate 061 that is left intact below the underlying material 062, as representing an exemplary approach to removing less than all of the substrate 061 underlying the suspended portion of the active material 063.

Additionally, as discussed above, in some embodiments, the area of the removed portion 065 of the underlying substrate 061 is left as-is (i.e. empty as free space) after the portion 065 is removed. In other embodiments, this area is refilled with another material to satisfy any of a variety of desired material, device, circuit, and system characteristics.

Figure 7:
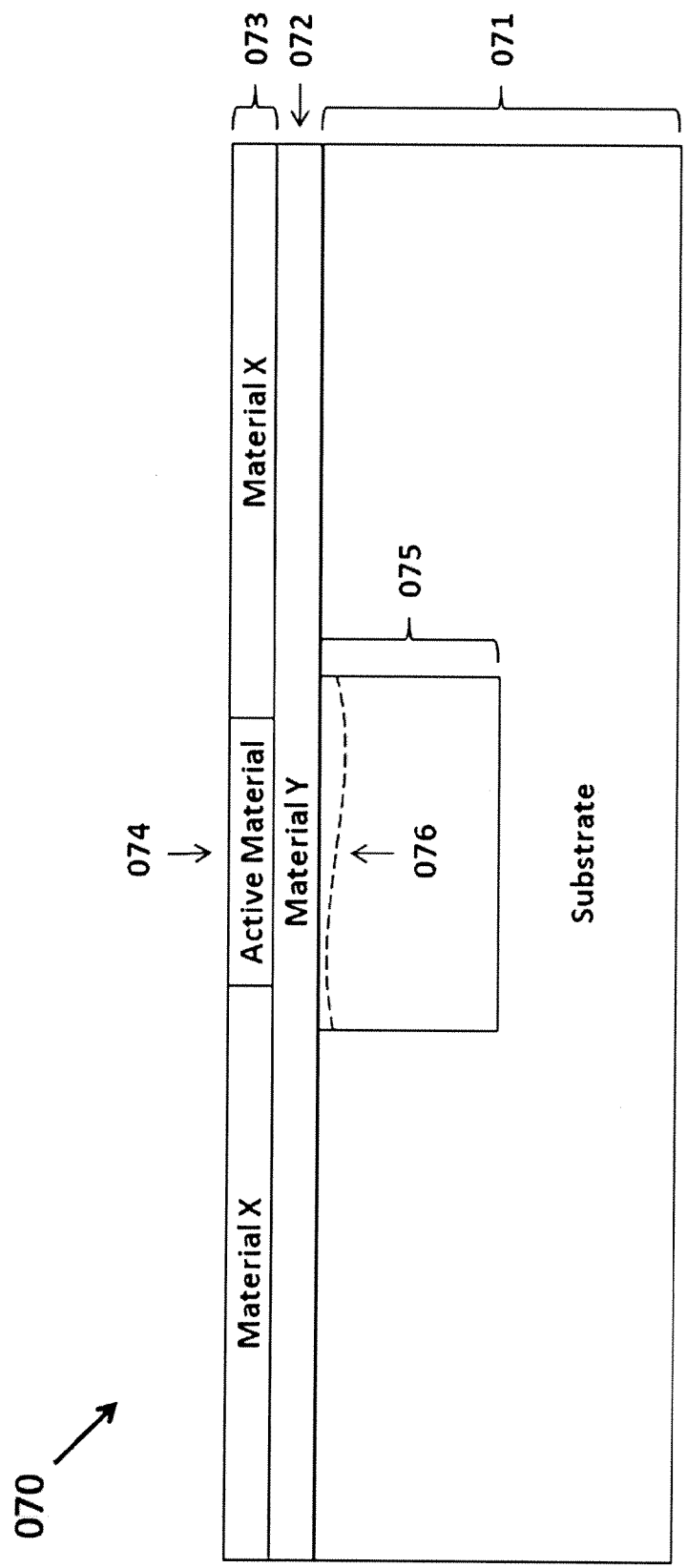
FIG. 7 depicts a cross-section of an active material-based structure having a strained active material horizontally adjacent to other materials and vertically adjacent to an underlying material over an underlying substrate, a portion of which is removed to a depth within the underlying substrate under an area of the active material, according to another example embodiment of the present invention.

FIG. 7 depicts a cross-section of an active material-based structure 070 having a strained active material 074 horizontally adjacent to other materials 073 and vertically adjacent to an underlying material 072 over an underlying substrate 071, a portion of which 075 is removed to a depth within the underlying substrate 071 under an area of the active material 074, according to another example embodiment of the present invention.

As discussed above, to facilitate the application of strain to the active material 074, a portion of the underlying substrate 071 is removed to expose a region 075, over which the active material 074 is suspended. The amount of the underlying substrate 071 removed below the active material 074 is based upon desired characteristics of the active material 074 and device/application considerations. Accordingly, dashed line 076 defines a region of the underlying substrate 071 that is left intact below the underlying material 072, as representing an exemplary approach to removing less than all of the substrate 071 underlying the suspended portion of the active material 074. Further, the amount of the underlying substrate 071 removed below the active material 074 to a depth within the underlying substrate 071 may also be determined by other desired material and device characteristics, which may include structural integrity of the remaining underlying substrate 071, device integration schemes, and others.

The respective materials 073 and 072 may include one or more of a variety of materials, which can be implemented to strain the active material 074 and/or to hold the active material 074 in a strained state. In some implementations, the horizontally adjacent materials 073 may be used to strain the active material 074, with the underlying material 072 used to hold the active material 074 in place. In other implementations, the underlying material 072 may be used to strain the active material 074, with the horizontally adjacent materials 073 used to hold the active material 074 in place. In still other implementations, both the horizontally adjacent materials 073 and the underlying material 072 may be used to both strain the active material 074 and hold the active material 074 in place. In still other implementations, other processing steps, such as thermal treatments, mechanical bending, and others, may be used to strain the active material 074, with the horizontally adjacent materials 073 and/or the underlying material 072 used to hold the active material 074 in place.

The specific fabrication process for the structure 070 can be carried out in one or more of a variety of manners, depending upon the desired material and device characteristics. In some embodiments, an initial active material-on-insulator stack (represented by 074, 072, and 071) can be released from the underlying substrate 071 (e.g. as shown at region 075), followed by the formation of horizontally adjacent stressed materials (represented by 073). In other embodiments, horizontally adjacent stressed materials (represented by 073) are formed first, with the material stack released from the underlying substrate 071 afterwards. Different approaches to the final strained material stack may be useful for different embodiments.

Additionally, as discussed above, in some embodiments, the area of the removed portion 075 of the underlying substrate 071 is left as-is (i.e. empty as free space) after the portion 075 is removed. In other embodiments, this area is refilled with another material to satisfy any of a variety of desired material, device, circuit, and system characteristics.

Figure 8:
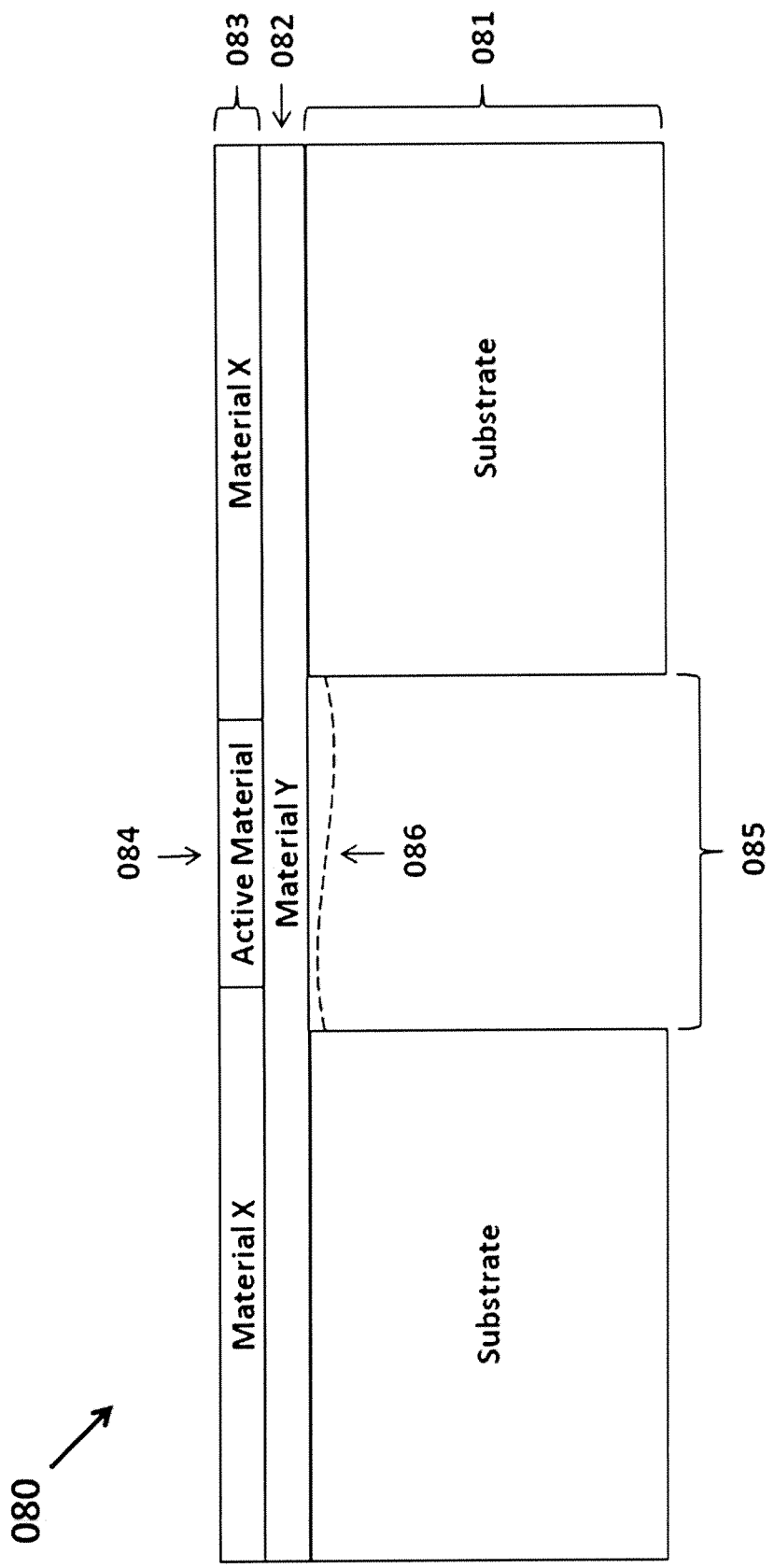
FIG. 8 depicts a cross-section of an active material-based structure having a strained active material horizontally adjacent to other materials and vertically adjacent to an underlying material over an underlying substrate, a portion of which is removed to the bottom of the underlying substrate under an area of the active material, according to another example embodiment of the present invention.

FIG. 8 depicts a cross-section of an active material-based structure 080, similar to that shown in FIG. 7, having a strained active material 084 horizontally adjacent to other materials 083 and vertically adjacent to an underlying material 082 over an underlying substrate 081, a portion of which 085 is removed to the bottom of the underlying substrate 081 under an area of the active material 084, according to another example embodiment of the present invention.

As discussed above, to facilitate the application of strain to the active material 084, a portion of the underlying substrate 081 is removed to expose a region 085, over which the active material 084 is suspended. The amount of the underlying substrate 081 removed below the active material 084 is based upon desired characteristics of the active material 084 and device/application considerations. Accordingly, dashed line 086 defines a region of the underlying substrate 081 that is left intact below the underlying material 082, as representing an exemplary approach to removing less than all of the substrate 081 underlying the suspended portion of the active material 084.

Additionally, as discussed above, in some embodiments, the area of the removed portion 085 of the underlying substrate 081 is left as-is (i.e. empty as free space) after the portion 085 is removed. In other embodiments, this area is refilled with another material to satisfy any of a variety of desired material, device, circuit, and system characteristics.

Figure 9:
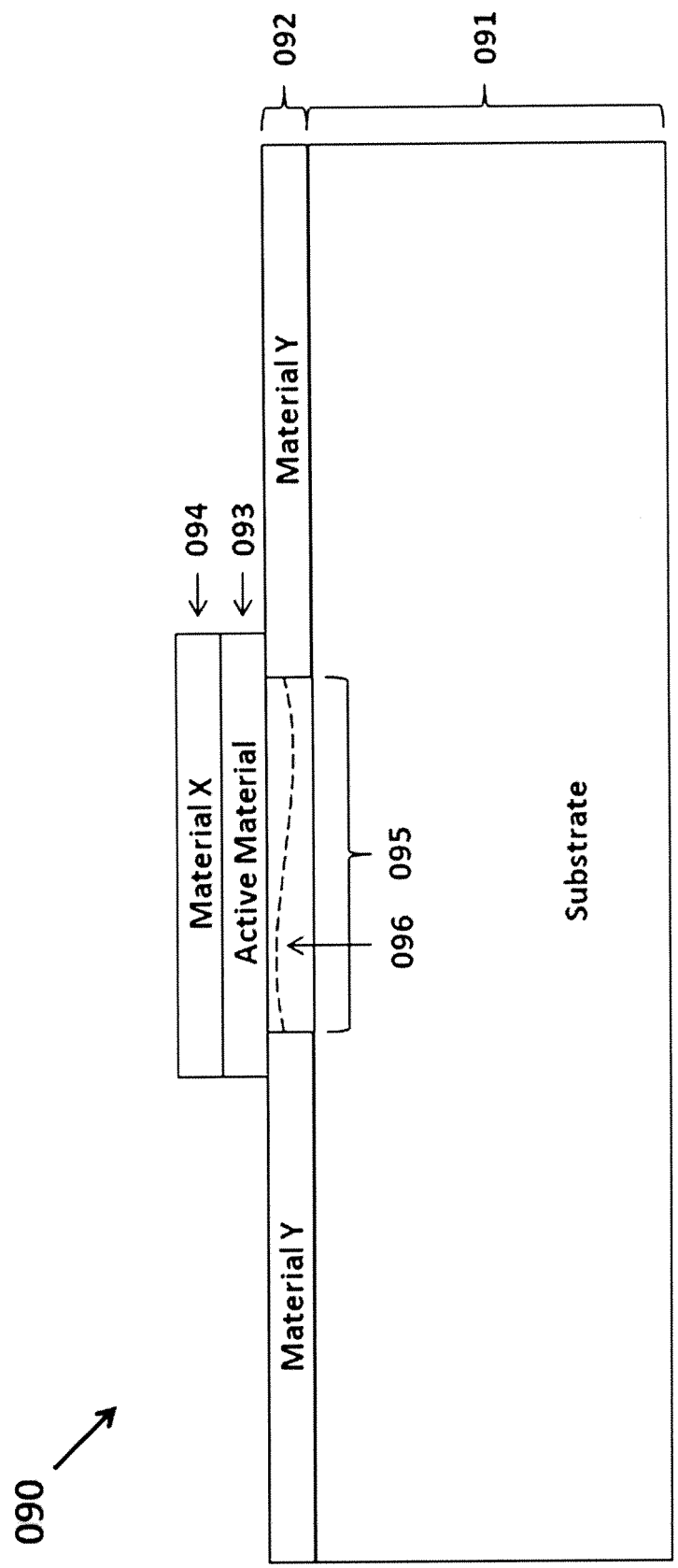
FIG. 9 depicts a cross-section of an active material-based structure having a strained active material vertically adjacent to an overlying material and an underlying material over an underlying substrate, where a portion of the underlying material is removed under an area of the active material, according to another example embodiment of the present invention.

FIG. 9 depicts a cross-section of an active material-based structure 090 having a strained active material 093 vertically adjacent to an overlying material 094 and an underlying material 092 over an underlying substrate 091, where a portion 095 of the underlying material 092 is removed under an area of the active material 093, according to another example embodiment of the present invention.

To facilitate the application of strain to the active material 093, a portion of the underlying material 092 is removed to expose a region 095, over which the active material 093 is suspended. The amount of the underlying material 092 removed below the active material 093 is based upon desired characteristics of the active material 093 and device/application considerations. Accordingly, dashed line 096 defines a region of the underlying material 092 that is left intact below the active material 093, as representing an exemplary approach to removing less than all of the material 092 underlying the suspended portion of the active material 093.

Additionally, in some embodiments, the area of the removed portion 095 of the underlying material 092 is left as-is (i.e. empty as free space) after the portion 095 is removed. In other embodiments, this area is refilled with another material to satisfy any of a variety of desired material, device, circuit, and system characteristics.

Figure 10:
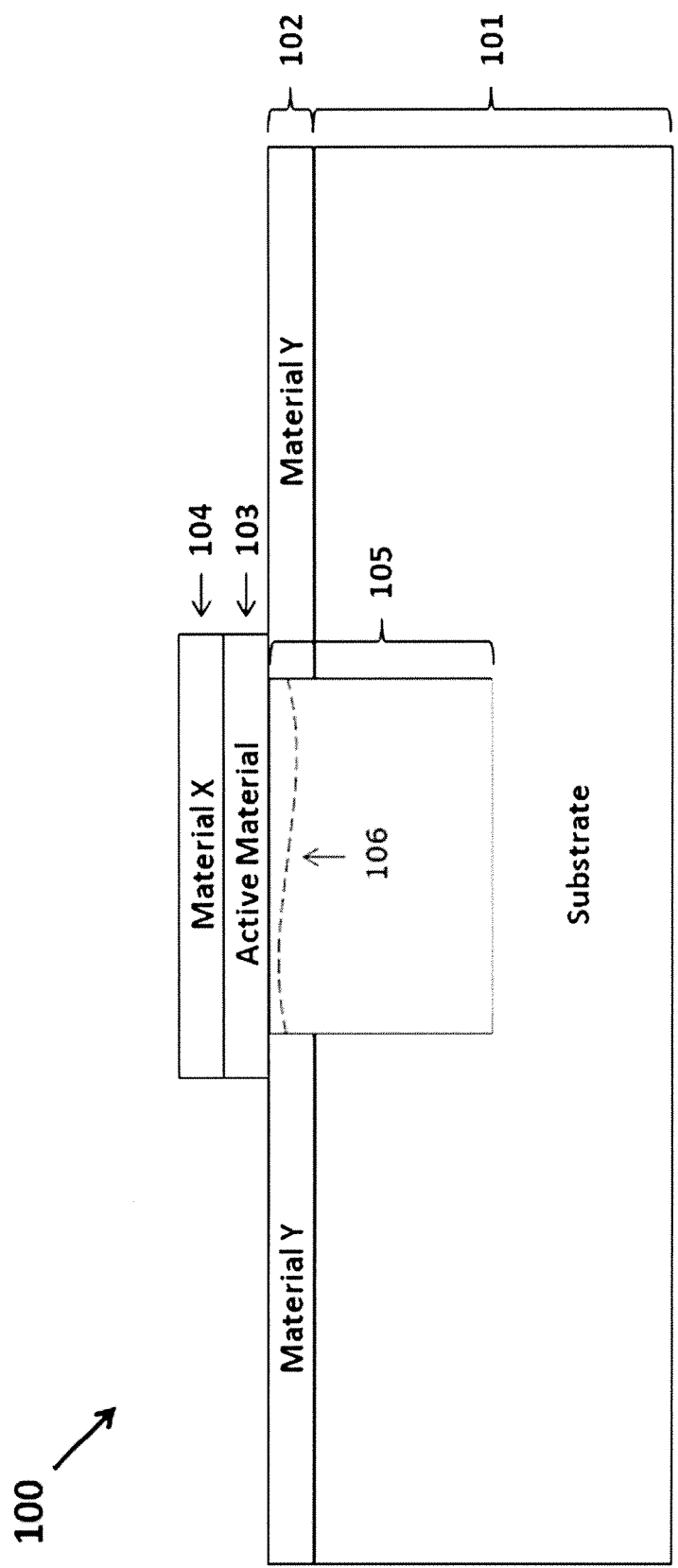
FIG. 10 depicts a cross-section of an active material-based structure having a strained active material vertically adjacent to an overlying material and an underlying material over an underlying substrate, where a portion of the underlying material and underlying substrate is removed to a depth within the underlying substrate under an area of the active material, according to another example embodiment of the present invention.

FIG. 10 depicts a cross-section of an active material-based structure 100 having a strained active material 103 vertically adjacent to an overlying material 104 and an underlying material 102 over an underlying substrate 101, where a portion 105 of the underlying material 102 and underlying substrate 101 is removed to a depth within the underlying substrate 101 under an area of the active material 103, according to another example embodiment of the present invention.

To facilitate the application of strain to the active material 103, a portion of the underlying material 102 and underlying substrate 101 is removed to expose a region 105, over which the active material 103 is suspended. The amount of the underlying material 102 and underlying substrate 101 removed below the active material 103 is based upon desired characteristics of the active material 103 and device/application considerations. Accordingly, dashed line 106 defines a region of the underlying material 102 that is left intact below the active material 103, as representing an exemplary approach to removing less than all of the material 102 underlying the suspended portion of the active material 103. Further, the amount of the underlying substrate 101 removed below the material 102 to a depth within the underlying substrate 101 may also be determined by other desired material and device characteristics, which may include structural integrity of the remaining underlying substrate 101, device integration schemes, and others.

Additionally, in some embodiments, the area of the removed portion 105 of the underlying material 102 and underlying substrate 101 is left as-is (i.e. empty as free space) after the portion 105 is removed. In other embodiments, this area is refilled with another material to satisfy any of a variety of desired material, device, circuit, and system characteristics.

Figure 11:
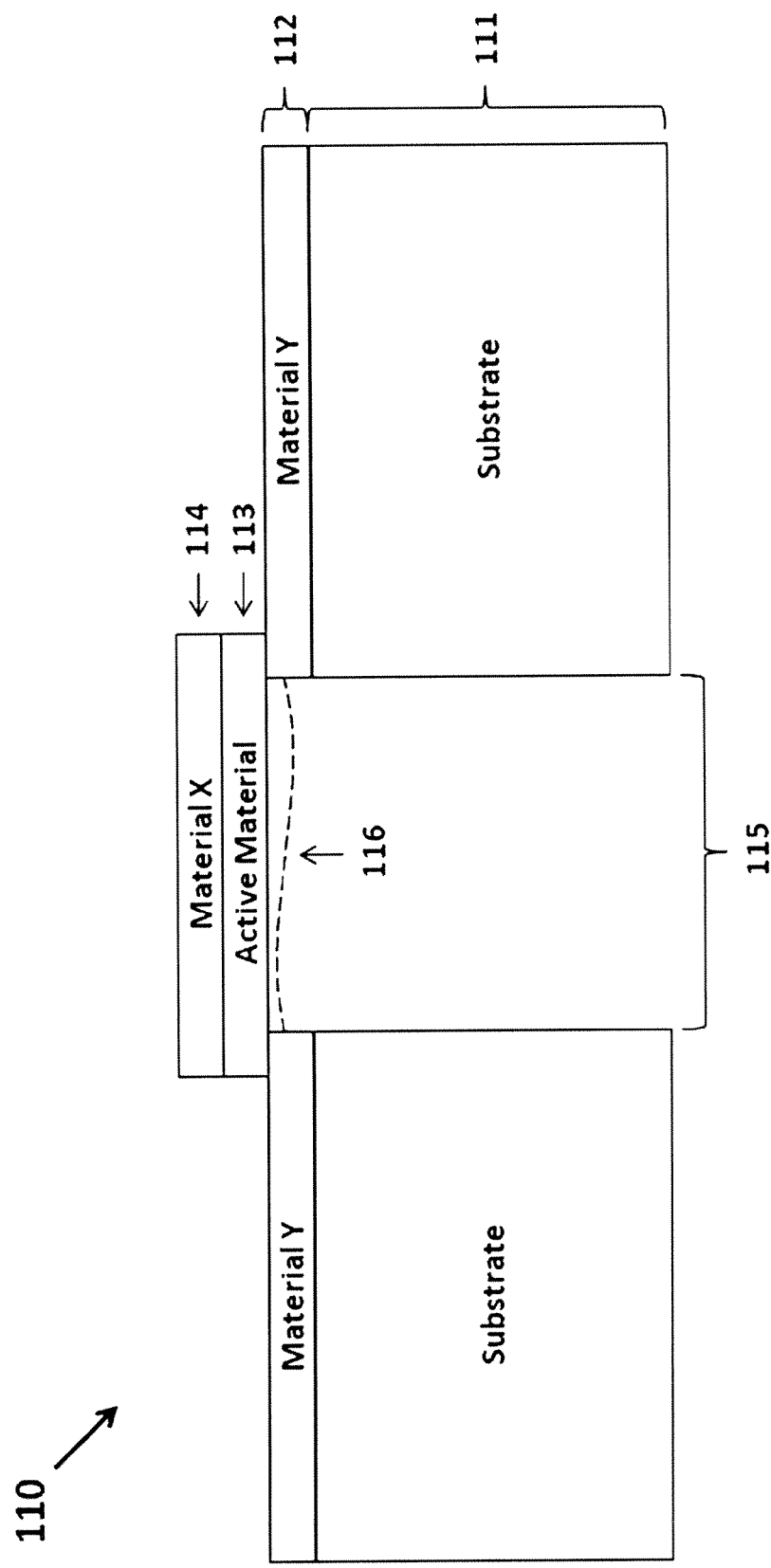
FIG. 11 depicts a cross-section of an active material-based structure having a strained active material vertically adjacent to an overlying material and an underlying material over an underlying substrate, where a portion of the underlying material and underlying substrate is removed to the bottom of the underlying substrate under an area of the active material, according to another example embodiment of the present invention.

FIG. 11 depicts a cross-section of an active material-based structure 110, similar to that shown in FIG. 10, having a strained active material 113 vertically adjacent to an overlying material 114 and an underlying material 112 over an underlying substrate 111, where a portion 115 of the underlying material 112 and underlying substrate 111 is removed to the bottom of the underlying substrate 111 under an area of the active material 113, according to another example embodiment of the present invention.

As discussed above, to facilitate the application of strain to the active material 113, a portion of the underlying material 112 and underlying substrate 111 is removed to expose a region 115, over which the active material 113 is suspended. The amount of the underlying material 112 and underlying substrate 111 removed below the active material 113 is based upon desired characteristics of the active material 113 and device/application considerations. Accordingly, dashed line 116 defines a region of the underlying material 112 that is left intact below the active material 113, as representing an exemplary approach to removing less than all of the material 112 underlying the suspended portion of the active material 113.

Additionally, as discussed above, in some embodiments, the area of the removed portion 115 of the underlying material 112 and underlying substrate 111 is left as-is (i.e. empty as free space) after the portion 115 is removed. In other embodiments, this area is refilled with another material to satisfy any of a variety of desired material, device, circuit, and system characteristics.

Figure 12:
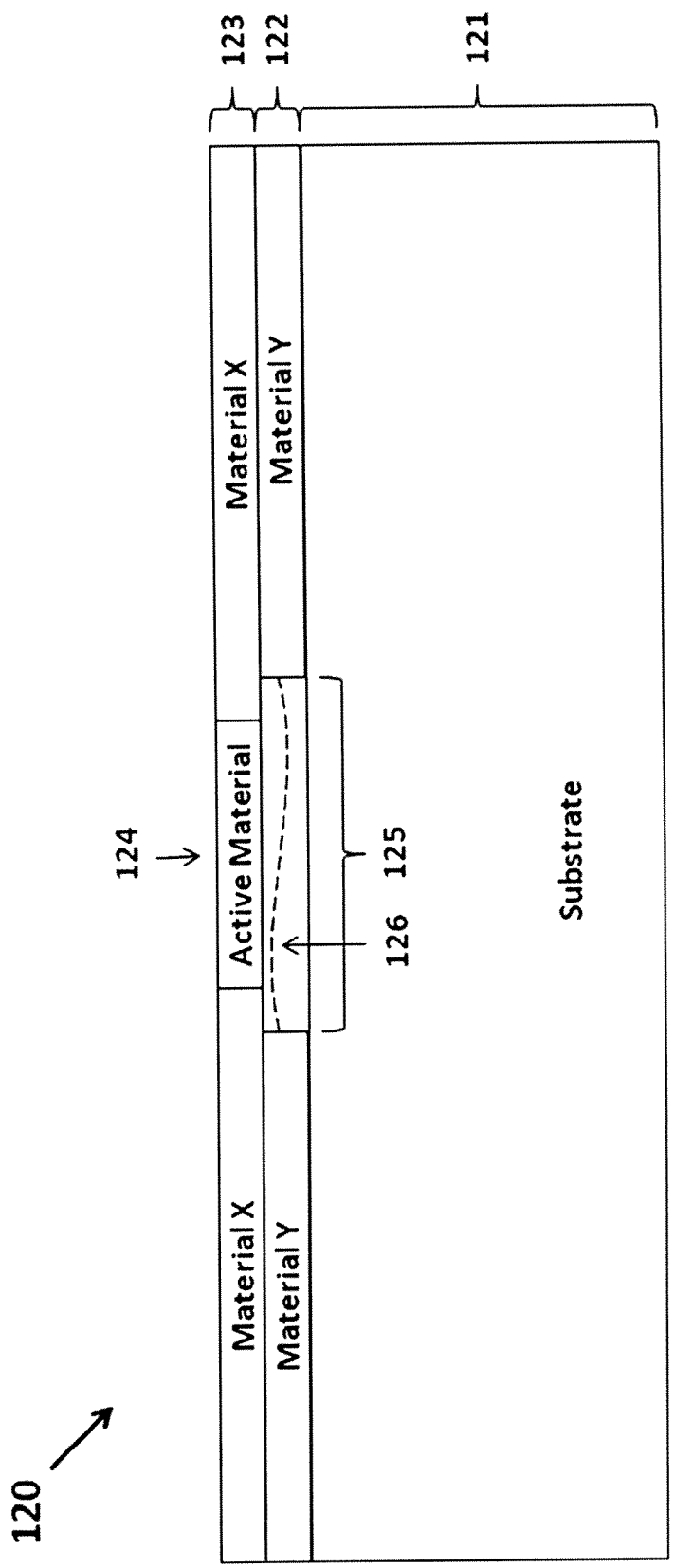
FIG. 12 depicts a cross-section of an active material-based structure having a strained active material horizontally adjacent to other materials and vertically adjacent to an underlying material over an underlying substrate, where a portion of the underlying material is removed under an area of the active material, according to another example embodiment of the present invention.

FIG. 12 depicts a cross-section of an active material-based structure 120 having a strained active material 124 horizontally adjacent to other materials 123 and vertically adjacent to an underlying material 122 over an underlying substrate 121, where a portion 125 of the underlying material 122 is removed under an area of the active material 124, according to another example embodiment of the present invention.

As discussed above, to facilitate the application of strain to the active material 124, a portion of the underlying material 122 is removed to expose a region 125, over which the active material 124 is suspended. The amount of the underlying material 122 removed below the active material 124 is based upon desired characteristics of the active material 124 and device/application considerations. Accordingly, dashed line 126 defines a region of the underlying material 122 that is left intact below the active material 124, as representing an exemplary approach to removing less than all of the material 122 underlying the suspended portion of the active material 124.

Additionally, in some embodiments, the area of the removed portion 125 of the underlying material 122 is left as-is (i.e. empty as free space) after the portion 125 is removed. In other embodiments, this area is refilled with another material to satisfy any of a variety of desired material, device, circuit, and system characteristics.

Figure 13:
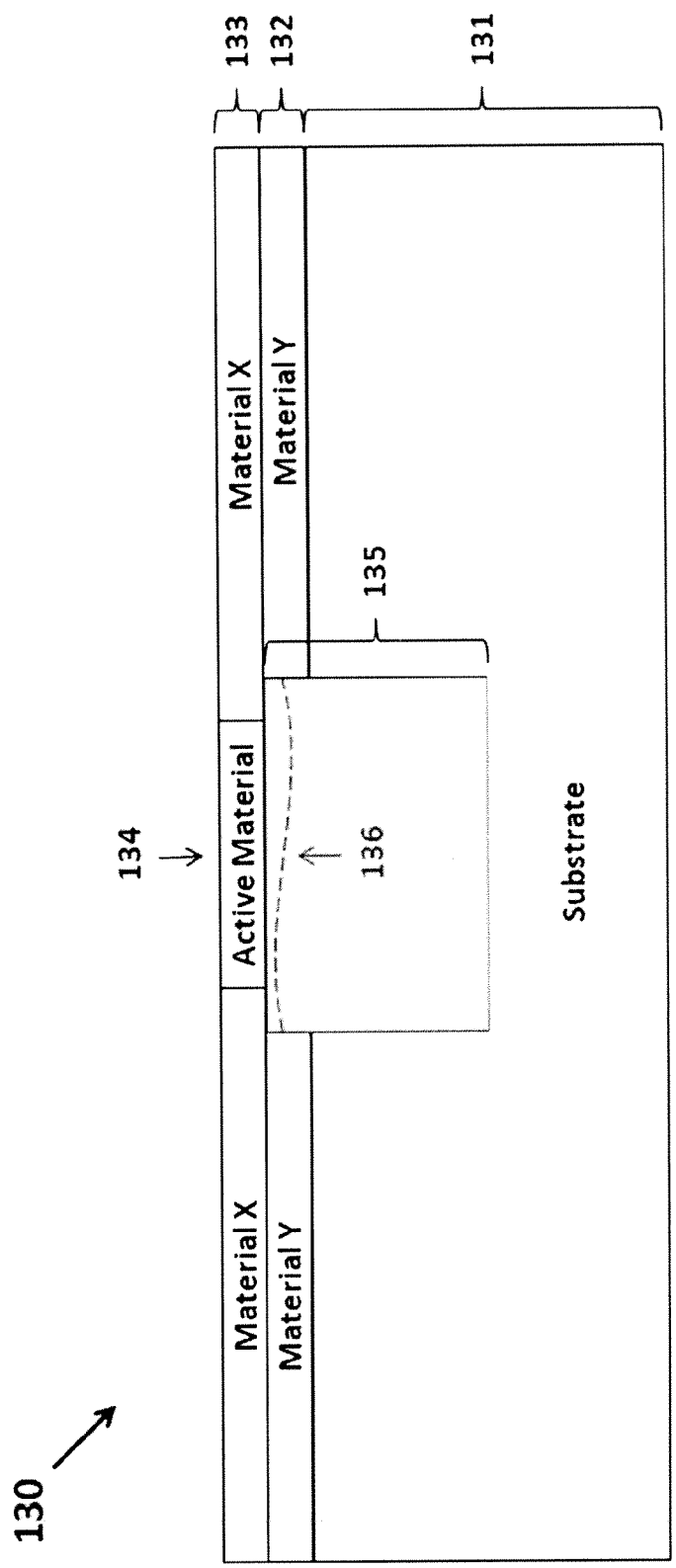
FIG. 13 depicts a cross-section of an active material-based structure having a strained active material horizontally adjacent to other materials and vertically adjacent to an underlying material over an underlying substrate, where a portion of the underlying material and underlying substrate is removed to a depth within the underlying substrate under an area of the active material, according to another example embodiment of the present invention.

FIG. 13 depicts a cross-section of an active material-based structure 130 having a strained active material 134 horizontally adjacent to other materials 133 and vertically adjacent to an underlying material 132 over an underlying substrate 131, where a portion of the underlying material 132 and underlying substrate 131 is removed to a depth within the underlying substrate 131 under an area of the active material 134, according to another example embodiment of the present invention.

As discussed above, to facilitate the application of strain to the active material 134, a portion of the underlying material 132 and underlying substrate 131 is removed to expose a region 135, over which the active material 134 is suspended. The amount of the underlying material 132 and underlying substrate 131 removed below the active material 134 is based upon desired characteristics of the active material 134 and device/application considerations. Accordingly, dashed line 136 defines a region of the underlying material 132 that is left intact below the active material 134, as representing an exemplary approach to removing less than all of the material 132 underlying the suspended portion of the active material 134. Further, the amount of the underlying substrate 131 removed below the material 132 to a depth within the underlying substrate 131 may also be determined by other desired material and device characteristics, which may include structural integrity of the remaining underlying substrate 131, device integration schemes, and others.

Additionally, in some embodiments, the area of the removed portion 135 of the underlying material 132 and underlying substrate 131 is left as-is (i.e. empty as free space) after the portion 135 is removed. In other embodiments, this area is refilled with another material to satisfy any of a variety of desired material, device, circuit, and system characteristics.

Figure 14:
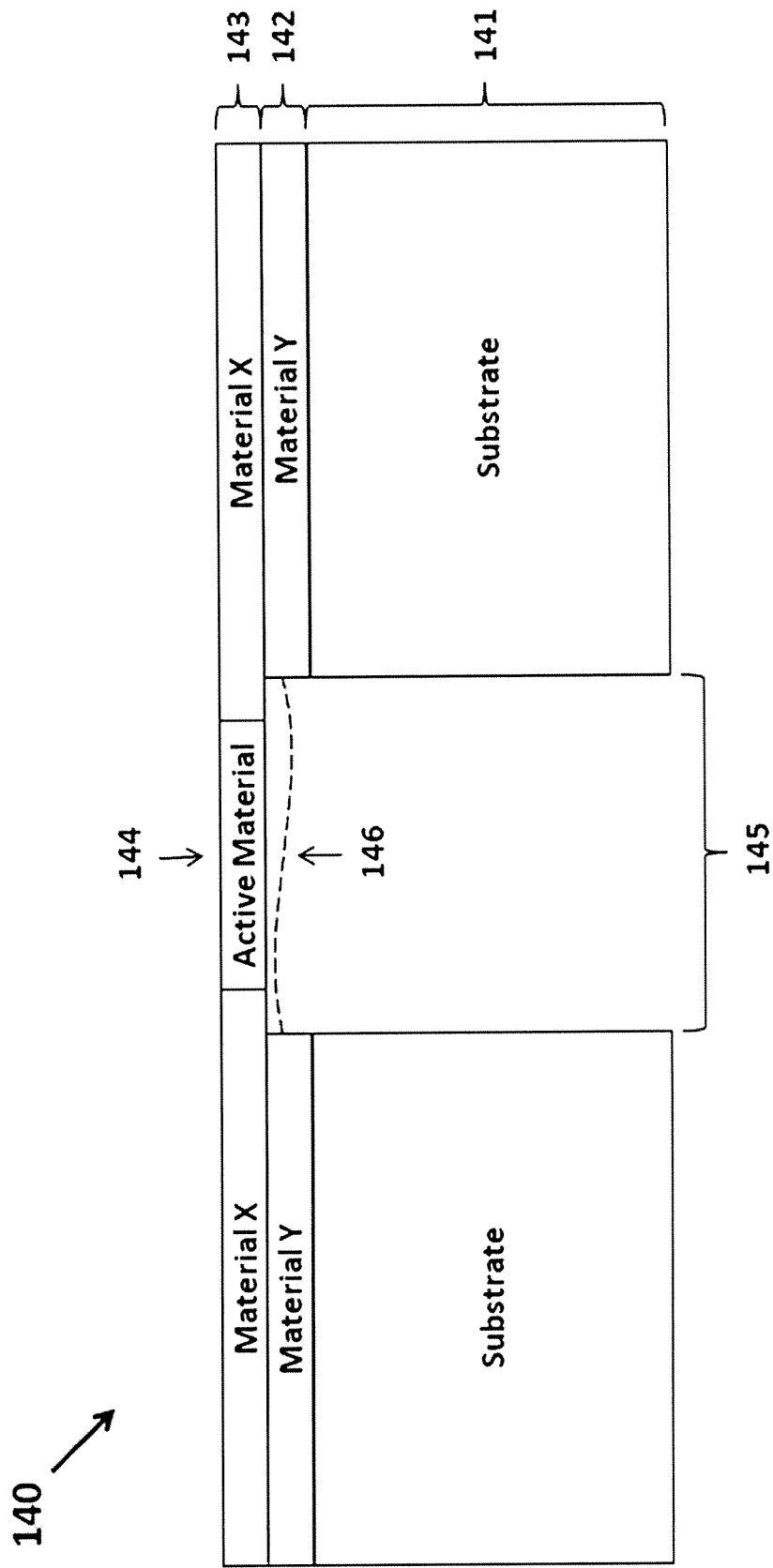
FIG. 14 depicts a cross-section of an active material-based structure having a strained active material horizontally adjacent to other materials and vertically adjacent to an underlying material over an underlying substrate, where a portion of the underlying material and underlying substrate is removed to the bottom of the underlying substrate under an area of the active material, according to another example embodiment of the present invention.

FIG. 14 depicts a cross-section of an active material-based structure 140, similar to that shown in FIG. 13, having a strained active material 144 horizontally adjacent to other materials 143 and vertically adjacent to an underlying material 142 over an underlying substrate 141, where a portion 145 of the underlying material 142 and underlying substrate 141 is removed to the bottom of the underlying substrate 141 under an area of the active material 144, according to another example embodiment of the present invention.

As discussed above, to facilitate the application of strain to the active material 144, a portion of the underlying material 142 and underlying substrate 141 is removed to expose a region 145, over which the active material 144 is suspended. The amount of the underlying material 142 and underlying substrate 141 removed below the active material 144 is based upon desired characteristics of the active material 144 and device/application considerations. Accordingly, dashed line 146 defines a region of the underlying material 142 that is left intact below the active material 144, as representing an exemplary approach to removing less than all of the material 142 underlying the suspended portion of the active material 144.

Additionally, as discussed above, in some embodiments, the area of the removed portion 145 of the underlying material 142 and underlying substrate 141 is left as-is (i.e. empty as free space) after the portion 145 is removed. In other embodiments, this area is refilled with another material to satisfy any of a variety of desired material, device, circuit, and system characteristics.

The strained-material structures as described herein may be formed in one or more of a variety of shapes and arrangements, including but not limited to those shown in FIGS. 1-14 and in the Appendix, which forms part of this patent document.

The following describes various embodiments, which may be applicable to one or more of the figures as described above, as well as to other embodiments described herein.

In one embodiment, a three-layer active material structure includes a 30 nm-thick diamond-like carbon (DLC) layer on a 100 nm-thick active material film, which is on a 100 nm-thick DLC layer. The material stack is partially suspended over a 5 µm hole in a silicon substrate, which facilitates the application of tensile strain to the active material film, by one or both DLC layers. In some implementations, greater than about 0.3% biaxial tensile strain is induced in the active material layer, which corresponds to a direct bandgap reduction in excess of 30 meV and a greater than 60 nm shift in the absorption edge towards longer wavelengths for the specific exemplary case of a germanium active layer.

In another embodiment, a four-layer active material structure includes a 30 nm-thick DLC layer on a 100 nm-thick active material layer, which is on a 100 nm-thick silicon nitride layer ($Si_3N_4$) on a 30 nm-thick silicon dioxide ($SiO_2$) layer, and the material stack is partially suspended over a 5 µm hole in a silicon substrate. In some implementations for the case of a germanium active layer, a tensile strain that is greater than about 0.4% is induced in the active material layer, which corresponds to a 40 meV reduction in the direct bandgap and at least an 80 nm absorption edge shift towards longer wavelengths. In one implementation, the DLC-active material-$Si_3N_4$—$SiO_2$ material stack is supported by beams at four locations from an underlying silicon substrate. In other implementations, such as those involving the use of horizontally-located stressor materials (e.g. as 073 of FIG. 7), well over 2% strain is induced upon an active material layer. In fact, for such a configuration as well as others, arbitrary amounts of strain can be applied depending on structure geometries, material compositions, and other characteristics. For these and other implementations, the amount of strain applied to a material can be set up to a threshold including and below which the material is capable of remaining intact under the strain, where such a threshold depends upon characteristics and arrangement of the material and its interactions with surrounding materials.

The materials as described herein may be formed and stressed using one or more of a variety of approaches. In some embodiments, an active material in a suspended material stack is relaxed, prior to stressing with another adjacent material as discussed above. In other embodiments, the active material is pre-stressed, prior to further stressing with another adjacent material. These approaches may be used with a variety of configurations, including an active material-on-insulator configuration, with a stressing material formed over the starting material stack after pre-relaxation or pre-stressing.

The substrate material over which the active material stack is formed can also be formed and/or arranged using one or more of a variety of approaches. In some embodiments, an underlying substrate is chosen to induce different properties in the active material. For example, an underlying substrate or material may be selected and used to set the crystal orientation and/or the initial strain state of the active material, where the active material is first formed on the substrate and subsequently suspended via removal of a portion of the substrate.

In addition, the shape and amount of substrate material that is etched or otherwise removed to suspend the active material stack can also be used to set the strain experienced by the active material. For instance, substrate material may be left in certain regions to add structural integrity to the active material stack while reducing the strain therein.

In addition, subsequent to the etching or otherwise removal of materials underlying an active material to allow for strain transfer, other materials may be formed to reconnect the active material to the underlying materials and/or substrate in whole or in part. For instance, a material may be used to refill the space underneath a strained active material stack in order to provide enhanced structural integrity, improved thermal conductivity, or any of other desired characteristics once strain has been introduced in the active material.

Different types of materials can be used to set the strain of active materials as described herein. For example, one embodiment is directed to using a transparent film on one or opposing sides of an active material film (e.g. as 064 and/or 062 of FIG. 6) to permit optical detection or emission from the active material film. In another embodiment, a highly stressed metal is deposited on an active material film as a capping layer (e.g. as 064 of FIG. 6) with a transparent dielectric (e.g. as 062 of FIG. 6) underneath the active material film. In this embodiment, the top metal could both induce strain in the active material and serve as electrode(s), while the optical absorption/emission is accomplished from the backside. In other embodiments, the size and geometry of a capping layer (e.g. as 013 of FIG. 1) is set to induce highly localized strains (e.g. with varying thickness, composition and/or location of a top layer), or to induce small, uniform strains (e.g. with a layer 013 across an entire active material film, or extending beyond such a film).

Suspended material stacks including an active material as discussed herein may be formed in one or more of a variety of shapes. In some implementations, the shape of the suspended material stack is set to correspondingly set characteristics of the active material, such as those relating to strain, stress gradient, light absorption, light emission, charge carrier mobility, and charge carrier scattering statistics, among others.

EXAMPLE 1

Devices Built on Strained Active Layers

An active-on-other material stack (e.g. germanium-on-insulator) is prepared by any of several methods. The starting material stack may be part of a semiconductor (e.g. silicon) wafer that includes fabrication of CMOS or other circuitry thereon. The active layer is patterned using photolithographic techniques common in semiconductor fabrication. In one example, this could include the coating, exposure, and development of a photoresist material that serves as a protective mask during subsequent etch and removal of the exposed active layer areas. The starting active layer may have a thickness determined by the need to satisfy any of various material, mechanical, and device specifications for a given application. For example, the range of active layer thicknesses appropriate for one such application may be 100 Å-10000 Å.

Another material under internal tensile stress is then deposited non-selectively on the patterned active layer and surrounding wafer surface. In one example, this deposited material may be a silicon nitride film deposited using any of several available techniques, including low-pressure chemical vapor deposition (LPCVD), plasma-enhanced chemical vapor deposition (PECVD), sputtering, etc. The thickness of the deposited stressed film is also determined by material, mechanical, and device specifications depending on the application. For example, for a 2500 Å-thick active layer, a stressor layer with thickness in the range of 2500 Å-10000 Å may be appropriate, depending on the application and other factors. The salient feature of the deposited film is the presence of internal tensile stress due to thermal considerations, internal atomic structure, or other factors. The deposited stressor layer is then patterned and etched to form structures physically connected to and overlapping the patterned active layer in some areas. In one example, a patterned active region may be rectangular, with the stressor layer etched to form two separate stressor regions on the wafer surface near opposite ends of the active region and partially overlapping the opposite active area ends in direct physical contact (e.g. similar to 070 in FIG. 7).

A photolithography process is then done to expose regions of the wafer surface near the active layer and stressor structures while protecting the rest of the wafer surface. Any of several etch procedures can then be done to free the active layer and part of the stressor structures from the underlying materials. In one example, a selective etch can be done to isotropically remove the material that was immediately underneath the active layer in the starting film stack (e.g. the oxide underlayer in a GOI wafer) while leaving all other materials intact (e.g. as 125 of FIG. 12). In another example, an etch through the underlying material layer (e.g. the oxide underlayer in a GOI wafer) can be done to expose the wafer substrate or second underlying material, which is then isotropically etched underneath the active layer and part of the stressor structures (e.g. as 075 of FIG. 7).

The stressor structures that are connected to the patterned active regions and have been freed from the underlying materials then relax and release their internal tensile stress through contraction. Provided the active layer is relatively more compliant, the internal stress in the released stressor regions is then transferred to the suspended patterned active regions.

The void left underneath an active region and part of the stressor structures as a result of the release etch can be left as-is or refilled using another material if desired, depending on application specifics. Electronic and/or optoelectronic devices can then be built on the strained active layer using a combination of fabrication steps, including but not limited to ion implantation steps, metal electrode deposition and patterning, and other processes used to fabricate various devices.

EXAMPLE 2

Photodetectors

Following the general method of Example 1, a photodetector can be made on an active layer that is strained either prior to device fabrication or as the final step in the device fabrication process.

For example, a strained metal-semiconductor-metal (MSM) photodetector can be fabricated by adding a metal evaporation and photoresist lift-off lithography process after the method of Example 1 is followed to apply strain to an active layer meant to serve as the absorption medium in the device. In one specific process example, a spray-coating system can be used to deposit photoresist on all accessible material surfaces after the release etch is done for the strain transfer. Then, after photoresist exposure and developing to form electrode patterns, a metal electrode stack (e.g. 150 Å of Titanium followed by 350 Å of Gold) can be evaporated non-selectively on the wafer surface. A metal lift-off process consisting of soaking the wafer in a solvent (e.g. acetone) to dissolve the remaining photoresist and remove the metal films lying on top of the dissolving photoresist can be done to leave the desirable electrode pattern in electrical contact with the strained active material. In an alternate process example, the above metallization steps can be inserted into the fabrication process of Example 1 before the release etch is performed. In this case, the MSM photodetector is first formed on the active material prior to the introduction of strain via the removal of underlying materials and/or substrate in the regions of interest.

As another photodetector device example, a strained pin photodetector can be fabricated by combining the metallization steps described above for the MSM photodetector device and engineering of the active material itself. For example, the pin device fabrication process may commence with the active material comprised of several layers of doped semiconductor arranged either vertically or horizontally to obtain a region of intrinsic semiconductor sandwiched between regions of n-type and p-type semiconductors (e.g. via the epitaxial growth of three layers of semiconductor under different in-situ doping conditions). The metallization and electrode definition steps would then be designed to yield electrical contact to the n- and p-type regions. As an alternate process, the pin doping arrangement of the active layer could be achieved by starting with an intrinsic semiconductor that is subsequently doped via patterned ion implantation steps at any of various points in the rest of the device fabrication process.

EXAMPLE 3

Light-Emitting Diodes

Following the general method of Example 1, a light-emitting diode (LED) can be made on an active layer that is strained either prior to device fabrication or as the final step in the device fabrication process. For example, a strained pin LED can be fabricated by combining the methods of Example 1 and Example 2 for the case of a pin photodetector.

As an alternate device example, a pn LED can be fabricated by combining the methods of Example 1 and Example 2 for the case of a pin photodetector but removing the intrinsic semiconductor from the material stack. In the case of epitaxially-obtained films, the starting active layer in this case could be comprised of two epitaxially-grown semiconductors, one of n-type doping and the other of p-type doping. Alternately, the starting active layer could be a single semiconductor of either n- or p-type doping. A subsequent ion implantation or other doping process can be done to introduce the opposite doping species to desired regions of the active layer to selectively change the electrical character of those regions. For example, in the case of an n-type starting film, p-type dopants could be ion implanted into certain regions of the active layer. In this case, enough of the implanted species would need to be introduced to counter the dopants already present and invert the character of the active layer in those regions.

EXAMPLE 4

Photonic Crystals

Following the general method of Example 1, a photonic crystal can be made on an active layer that is strained either prior to device fabrication or as the final step in the device fabrication process.

For example, a strained photonic crystal can be fabricated by incorporating in the active layer pattern of Example 1 an additional pattern of holes of a desired size and arrangement to yield a photonic crystal in the active layer. In this approach, the hole pattern comprising the photonic crystal and the containing active layer pattern in which the holes are to be incorporated would be defined and etched simultaneously. Subsequent processing could proceed as normally described in the method of Example 1, with release etching done as normal or modified to also act through the photonic crystal holes in the active layer. The latter approach may be chosen to enhance the release etch rate, uniformity, mechanical integrity, and other factors of the active layer and device.

In an alternate process example, the photonic crystal hole pattern may be incorporated in the active layer after the release etch is performed. In this case, a spray-coating system may be used to deposit photoresist on the strained active layer. Exposure and develop steps following by etching would then be done to transfer the desired hole pattern onto the active layer, yielding a strained photonic crystal.

Without limitation, a variety of embodiments are directed to implementations consistent with those presented in the attached Appendix, which forms part of this patent document. For instance, one or more embodiments as described herein and/or as part of the claims may be implemented with one or more embodiments shown in and/or described in connection with the Appendix, alone, in combination with other embodiments, or in connection with other embodiments not described here.

The various embodiments described above are provided by way of illustration and should not be construed to limit the invention. Based upon the above discussion and illustrations, those skilled in the art will recognize that various modifications and changes may be made to the present invention without strictly following the exemplary embodiments and applications illustrated and described herein. Such modifications and changes do not depart from the true spirit and scope of the present invention, including that set forth in the following claims.

The invention claimed is:

1. An optoelectronic device comprising:
a substrate including a first portion, the substrate being removed to a first depth in the first portion;
an active layer that is suspended over the first portion, the active layer comprising a first material, the first material being characterized by a first band structure having a first direct bandgap when in bulk form; and
a first layer that is horizontally adjacent to and in physical contact with the active layer;
wherein the first material is characterized by a second band structure having a second direct bandgap that is different than the first direct bandgap when the active layer is suspended over the first portion.

2. The optoelectronic device of claim 1, wherein at least a portion of the first layer is suspended over the first portion.

3. The optoelectronic device of claim 1, wherein the first material comprises germanium.

4. The optoelectronic device of claim 1, wherein the first material is non-absorptive for light at a first wavelength when it is characterized by the first band structure, and wherein the first material is absorptive for light at the first wavelength when it is characterized by the second band structure.

5. The optoelectronic device of claim 4, wherein the optoelectronic device comprises a light-emitting device that emits light at the first wavelength.

6. The optoelectronic device of claim 5, wherein the optoelectronic device comprises a light-emitting diode.

7. The optoelectronic device of claim 5, wherein the optoelectronic device comprises a laser.

8. The optoelectronic device of claim 4, wherein the optoelectronic device comprises a photodetector that is operable for detecting light at the first wavelength.

9. The optoelectronic device of claim 4, wherein the optoelectronic device comprises an optical modulator that is operable for modulating light at the first wavelength.

10. The optoelectronic device of claim 1, wherein the first layer comprises a plurality of holes, and wherein the first layer and the plurality of holes collectively define a photonic crystal.

11. The optoelectronic device of claim 1, wherein the first layer comprises a plurality of epilayers, and wherein at least one of the plurality of epilayers comprises a second material.

12. The optoelectronic device of claim 1, wherein the optoelectronic device comprises a device structure that excludes the first layer.

13. An optoelectronic device comprising:
a substrate including a first portion, the substrate being at least partially removed to a first depth within the first portion;
an active layer comprising a first material that has a band structure having a direct bandgap, the first material having a first absorptivity for light at a first wavelength when the first material is in bulk form; and
a first layer that is horizontally adjacent to the active layer, the first layer being dimensioned and arranged to suspend the active layer over the first portion;
wherein the first material has a second absorptivity for light at the first wavelength when the active layer is suspended over the first portion, and wherein the second absorptivity is greater than the first absorptivity.

14. The optoelectronic device of claim 13, further comprising a region of the substrate that is in physical contact with the active layer in the first portion.

15. The optoelectronic device of claim 13, wherein the first layer comprises a plurality of holes, and wherein the first layer and the plurality of holes collectively define a photonic crystal.

16. The optoelectronic device of claim 13, wherein the first material comprises germanium.

17. The optoelectronic device of claim 13, wherein the optoelectronic device comprises a light-emitting device that emits light at the first wavelength.

18. The optoelectronic device of claim 13, wherein the optoelectronic device comprises a photodetector that is operable for detecting light at the first wavelength.

19. The optoelectronic device of claim 13, wherein the optoelectronic device comprises an optical modulator that is operable for modulating light at the first wavelength.

20. The optoelectronic device of claim 13, wherein the active layer comprises germanium and the substrate comprises silicon.

* * * * *